United States Patent
Koshiishi et al.

(10) Patent No.: US 8,008,596 B2
(45) Date of Patent: Aug. 30, 2011

(54) PLASMA PROCESSING APPARATUS AND ELECTRODE USED THEREIN

(75) Inventors: Akira Koshiishi, Nirasaki (JP); Takashi Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1201 days.

(21) Appl. No.: 11/686,500

(22) Filed: Mar. 15, 2007

(65) Prior Publication Data

US 2007/0215580 A1    Sep. 20, 2007

Related U.S. Application Data

(60) Provisional application No. 60/785,349, filed on Mar. 24, 2006.

(30) Foreign Application Priority Data

Mar. 16, 2006    (JP) ................................. 2006-072384

(51) Int. Cl.
    *B23K 10/00*    (2006.01)
(52) U.S. Cl. ......... 219/121.39; 219/121.52; 219/121.43; 219/121.41; 118/723 I; 118/723 R; 156/345.47
(58) Field of Classification Search ............... 219/121.4, 219/121.41, 121.43, 121.44, 121.48, 121.52; 118/723 R, 723 I; 156/345.48, 345.51
See application file for complete search history.

(56) References Cited

U.S. PATENT DOCUMENTS

| 6,228,438 | B1 | 5/2001 | Schmitt | |
| 7,525,787 | B2 * | 4/2009 | Dhindsa et al. | 361/234 |
| 7,784,426 | B2 * | 8/2010 | Schmitt | 118/723 E |
| 2005/0276928 | A1 | 12/2005 | Okumura et al. | |

FOREIGN PATENT DOCUMENTS

| JP | 2001-298015 | 10/2001 |
| JP | 2003-504842 | 2/2003 |
| JP | 2006-41088 | 2/2006 |
| KR | 10-2005-0094475 | 9/2005 |

OTHER PUBLICATIONS

Office Action issued Nov. 24, 2010, in Japanese Patent Application No. 2006-072384.

* cited by examiner

*Primary Examiner* — Mark H Paschall
(74) *Attorney, Agent, or Firm* — Oblon, Spivak, McClelland, Maier & Neustadt, L.L.P.

(57) ABSTRACT

A plasma processing apparatus performs a specific plasma processing on a target substrate by disposing a first and a second electrode to face each other in a processing chamber, and supplying high-frequency electric power to at least one of the first and the second electrodes to thereby generate a plasma while introducing a processing gas onto the target substrate supported by the second electrode. The electrode for use as the first electrode includes: an electrode plate facing the second electrode; a support for supporting the electrode plate, wherein the support is in contact with a surface of the electrode plate and the surface is opposite to the second electrode; and a dielectric portion, provided on a contact surface of the support with the electrode plate, and having a shape in which a center portion thereof has a height different from that of an edge portion thereof.

20 Claims, 13 Drawing Sheets

PLASMA PROCESSING APPARATUS AND ELECTRODE USED THEREIN

FIELD OF THE INVENTION

The present invention relates to a plasma processing apparatus and an electrode used therein.

BACKGROUND OF THE INVENTION

In a semiconductor device manufacturing process, plasma processes such as etching, sputtering, CVD (chemical vapor deposition) and the like are mainly performed on a substrate to be processed, e.g., a semiconductor wafer (hereinafter, simply referred to as "wafer"). As plasma processing apparatuses for carrying out such plasma processes, capacitively coupled parallel plate plasma processing apparatuses are widely used.

In this kind of plasma processing apparatus, a pair of parallel plate electrodes (an upper electrode and a lower electrode) is disposed in a chamber, and a processing gas is introduced into the chamber. By applying high-frequency electric power to at least one of the electrodes, a high-frequency electric field is formed between the electrodes and a plasma of the processing gas is generated by means of the high-frequency electric field, and then a plasma process is performed on a wafer by using the plasma.

Meanwhile, recently, in the ULSI (ultra large scale integration), the downscaling of design rules has been gradually progressing, and a higher aspect ratio of a hole shape has been required. In consideration of this situation, an attempt has been made to further raise the frequency of the high-frequency electric power applied to the above-described parallel plate electrodes to thereby form a high density plasma while maintaining the plasma in a well-dissociated state. Thus, it is possible to form appropriate plasma under lower pressure conditions, so that it is possible to more appropriately cope with the downscaling of the design rules.

However, in the above-described plasma processing apparatus, since the upper electrode is formed of a conductor or a semiconductor, there are the following disadvantages. When the applied frequency of the high-frequency electric power is raised in order to form the high-density plasma, the inductance on surfaces of the electrode to which the high frequency wave is applied reaches a significant level. Thus, electric field becomes stronger at the center portion of the electrode, and the distribution of the electric field becomes non-uniform in the radial direction. When the electric field distribution becomes non-uniform in this manner, the plasma density becomes non-uniform, which affects the uniformity of the etching and so on.

In this respect, for example, according to the technology disclosed in Japanese Patent Laid-open Application No. 2001-298015, an electrode plate of the upper electrode is provided with a hollow portion having a disk shape at the center portion of a rear side thereof, so that the high-frequency electric power supplied to the upper electrode causes the resonance in the hollow portion and the electric field perpendicular to the electrode plate. Thereby, the electric field formed directly under the hollow portion, i.e. at the center portion of the electrode, is controlled. This technology can reduce the non-uniformity of the electric field at the center portion of the electrode, i.e., directly under the hollow portion, compared to the case in which no hollow portion is provided on the rear side of the electrode plate of the upper electrode.

In this manner, the provision of a one-stage hollow portion at the center portion of the rear side of the electrode plate is allowed to remarkably increase the uniformity of the electric field at the center portion of the electrode. However, there is a limitation in increasing a uniformity of the electric field at the edge portion of the electrode to be the same level as that at the center portion of the electrode. For example, when an attempt is made to further increase the uniformity of the electric field at the edge portion of the electrode by adjusting the dimensions (diameter and height) of the one-stage hollow portion, the uniformity of the electric field at the center portion of the electrode tends to decrease. For this reason, it is difficult to further increase the uniformity of the electric field at the edge portion of the electrode while the uniformity of the electric field at the center portion of the electrode is maintained.

SUMMARY OF THE INVENTION

It is, therefore, an object of the present invention to provide a plasma processing apparatus and an electrode used therein, capable of generating a plasma having extremely high uniformity by further decreasing the non-uniformity of electric field distribution on the electrode surface in a large area from the center portion to the edge portion of the electrode.

In accordance with one aspect of the present invention, there is provided an electrode for use as a first electrode in a plasma processing apparatus for performing a specific plasma processing on a target substrate by disposing the first and a second electrode to face each other in a processing chamber, and supplying high-frequency electric power to at least one of the first and the second electrodes to thereby generate a plasma while introducing a processing gas onto the target substrate supported by the second electrode, the electrode for use as the first electrode including:

an electrode plate facing the second electrode;

a support for supporting the electrode plate, wherein the support is in contact with a surface of the electrode plate and the surface is opposite to the second electrode; and a dielectric portion, provided on a contact surface of the support with the electrode plate, and having a shape in which a center portion thereof has a height different from that of an edge portion thereof.

In accordance with another aspect of the present invention, there is provided a plasma processing apparatus for performing a specific plasma processing on a target substrate by disposing a first and a second electrode to face each other in a processing chamber, and supplying high-frequency electric power to at least one of the first and the second electrodes to thereby generate a plasma while introducing a processing gas onto the target substrate supported by the second electrode, wherein the first electrode includes an electrode plate facing the second electrode; a support for supporting the electrode plate, wherein the support is in contact with a surface of the electrode plate and the surface is opposite to the second electrode; and a dielectric portion, provided on a contact surface of the support with the electrode plate, and having a shape in which a center portion thereof has a height different from that of an edge portion thereof.

In accordance with the present invention, the support is provided with the dielectric portion (e.g. a hollow portion) on the surface thereof that is in contact with the electrode plate, so that resonance occurs in the dielectric portion due to the high-frequency electric power supplied to the electrode, and an electric field perpendicular to the electrode plate is generated in the dielectric portion. Thereby, the electric field of the dielectric portion is combined with that of the electrode. In this case, the dielectric portion has a shape in which the center portion thereof has a height different from that of the edge portion thereof. Hence, with this electric field generated by this dielectric portion, the electric field strength in the electrode plate, i.e., the electric field in a large area from the center of the electrode to the edge thereof, can be controlled. Thereby, the non-uniformity of electric field distribution on the surface of the electrode can be further reduced in a large area from the center of the electrode to the edge thereof, so that plasma having extremely high uniformity can be generated.

It is preferable that the dielectric portion has a shape in which the height of the center portion thereof is higher than that of the edge portion thereof. The dielectric portion has a shape, e.g., in which disk-like dielectric portions having different diameters from each other are stacked in multiple stages, and the disk-like dielectric portions are stacked from the contact surface with the electrode plate in decreasing order of the diameters. Thereby, since the dielectric portion is formed on the contact surface of the support with the electrode plate, it is easy to form the dielectric portion.

In accordance with still another aspect of the present invention, there is provided an electrode for use as a first electrode in a plasma processing apparatus for performing a specific plasma processing on a target substrate by disposing the first and a second electrode to face each other in a processing chamber, and supplying high-frequency electric power to at least one of the first and the second electrodes to thereby generate a plasma while introducing a processing gas onto the target substrate supported by the second electrode, the electrode for use as the first electrode including:

an electrode plate facing the second electrode;

a support for supporting the electrode plate, wherein the support is in contact with a surface of the electrode plate and the surface is opposite to the second electrode; and a dielectric portion provided on a contact surface of the support with the electrode plate, wherein the dielectric portion has a shape in which a first, a second and a third disk-like dielectric portions having different diameters from each other are stacked from the contact surface with the electrode plate such that the height of the center portion thereof is higher than that of the edge portion thereof.

In accordance with still another aspect of the present invention, there is provided a plasma processing apparatus for performing a specific plasma processing on a target substrate by disposing a first and a second electrode to face each other in a processing chamber, and supplying high-frequency electric power to at least one of the first and the second electrodes to thereby generate a plasma while introducing a processing gas onto the target substrate supported by the second electrode, wherein the first electrode includes an electrode plate facing the second electrode; a support for supporting the electrode plate, wherein the support is in contact with a surface of the electrode plate and the surface is opposite to the second electrode; and a dielectric portion provided on a contact surface of the support with the electrode plate, and wherein the dielectric portion has a shape in which a first, a second and a third disk-like dielectric portions having different diameters from each other are stacked from the contact surface with the electrode plate such that the height of the center portion thereof is higher than that of the edge portion thereof.

It is preferable that the diameters of the first, the second and the third disk-like dielectric portions are in ranges from about 80% to 120%, from about 60% to 80% and from about 40% to 60% of the diameter of the target substrate, respectively.

It is preferable that a plurality of gas injection openings for supplying a gas toward target the substrate is provided at the electrode plate, wherein the greatest one among the diameters of the disk-like dielectric portions is at least greater than a diameter of an area in which the gas injection openings are formed. Thereby, the uniformity of the electric field on the surface of the electrode can be increased in a large area from the center to the edge while preventing abnormal discharge which can be generated at a boundary between the support and the electrode plate.

In accordance with still another aspect of the present invention, there is provided an electrode for use as a first electrode in a plasma processing apparatus for performing a specific plasma processing on a target substrate by disposing the first and a second electrode to face each other in a processing chamber; dividing the first electrode into a plurality of gas inlets; providing each gas inlet with a plurality of gas injection openings; and supplying high-frequency electric power to at least one of the first and the second electrodes to thereby generate a plasma while introducing a processing gas from each gas inlet onto the target substrate supported by the second electrode, the electrode for use as the first electrode including:

an electrode plate facing the second electrode;

a support for supporting the electrode plate, wherein the support is in contact with a surface of the electrode plate and the surface is opposite to the second electrode;

a hollow portion, provided on a contact surface of the support with the electrode plate, and having a shape in which a center portion thereof has a height different from that of an edge portion thereof; and a partition member for partitioning the hollow portion into a plurality of regions, each region belonging to one of the gas inlets.

In accordance with still another aspect of the present invention, there is provided a plasma processing apparatus for performing a specific plasma processing on a target substrate by disposing a first and a second electrode to face each other in a processing chamber; dividing the first electrode into a plurality of gas inlets; providing each gas inlet with a plurality of gas injection openings; and supplying high-frequency electric power to at least one of the first and the second electrodes to thereby generate a plasma while introducing a processing gas from each gas inlet onto the target substrate supported by the second electrode, wherein the first electrode includes an electrode plate facing the second electrode; a support for supporting the electrode plate, wherein the support is in contact with a surface of the electrode plate and the surface is opposite to the second electrode; a hollow portion, provided on a contact surface of the support with the electrode plate, and having a shape in which a center portion thereof has a height different from that of an edge portion thereof; and a partition member for partitioning the hollow portion into a plurality of regions, each region belonging to one of the gas inlets.

In accordance with the present invention, a first electrode (e.g. an upper electrode) capable of being applied to the plasma processing apparatus introducing the gas into the processing chamber through two lines can be provided. Even if the hollow portion is provided to the support over the plurality of gas inlets with a large diameter, the partition member partitions the hollow portion for each gas inlet, so that the gases supplied to the gas inlets can be prevented from being mixed with each other.

It is preferable that the partition member is formed of an insulator, rather than a conductor such as metal. Thereby, abnormal discharge, due to the concentration of the electric field on the partition member when applying the high-frequency electric power to the electrode, can be prevented from being generated.

It is preferable that the partition member is formed of a resin ring whose side surface is a tapered surface having a cross section of an approximate v shape. In this manner, the partition member formed of resin can prevent the abnormal discharge while the partition member, which has the shape of a ring whose side surface is a tapered surface having a cross section of an approximate V shape, can be elastically-deformed easily and have weak repulsive force. Therefore, the electrode plate can be firmly attached to the support, even if the clamping power between the support and the electrode plate is weak, for example. Further, it is preferable that the partition member is formed by thermally spraying ceramic-based material. Thereby, the abnormal discharge can be prevented.

In accordance with still another aspect of the present invention, there is provided a plasma processing apparatus for performing a specific plasma processing on a target substrate by disposing a first and a second electrode to face each other in a processing chamber; dividing the first electrode into a first and a second gas inlet; providing each gas inlet with a plurality of gas injection openings; and supplying high-frequency electric power to at least one of the first and the second electrodes to thereby generate a plasma while introducing a processing gas from each gas inlet onto the target substrate supported by the second electrode, the plasma processing apparatus including:

a processing gas supply unit for supplying the processing gas for processing the target substrate;

a processing gas supply line for allowing the processing gas from the processing gas supply unit to flow therein;

a first and a second branch line branched from the processing gas supply line to be connected with the first and the second gas inlet, respectively;

a branch flow control unit for controlling branch flows of the processing gas distributed from the processing gas supply line to the first and the second branch line based on inner pressures of the first and the second branch line, respectively;

an additional gas supply unit for supplying an additional gas; and an additional gas supply line, joining the first or the second branch line at a downstream side of the branch flow control unit, for allowing the additional gas from the additional gas supply unit to flow therein, wherein the first electrode includes an electrode plate facing the second electrode; a support for supporting the electrode plate, wherein the support is in contact with a surface of the electrode plate and the surface is opposite to the second electrode; a hollow portion, provided on a contact surface of the support with the electrode plate, and having a shape in which a center portion thereof has a height different from that of an edge portion thereof; and a partition member for partitioning the hollow portion into a plurality of regions, each region belonging to one of the gas inlets.

In accordance with still another aspect of the present invention, there is provided a plasma processing apparatus for performing a specific plasma processing on a target substrate by disposing a first and a second electrode to face each other in a processing chamber; dividing the first electrode into a first and a second gas inlet; providing each gas inlet with a plurality of gas injection openings; and supplying high-frequency electric power to at least one of the first and the second electrodes to thereby generate a plasma while introducing a processing gas from each gas inlet onto the target substrate supported by the second electrode, the plasma processing apparatus including:

a processing gas supply unit for supplying the processing gas for processing the target substrate;

a processing gas supply line for allowing the processing gas from the processing gas supply unit to flow therein;

a first and a second processing gas branch line branched from the processing gas supply line to be connected with the first and the second gas inlet, respectively;

a branch flow control unit for controlling branch flows of the processing gas distributed from the processing gas supply line to the first and the second processing gas branch line based on inner pressures of the first and the second processing gas branch line, respectively;

an additional gas supply unit for supplying an additional gas;

an additional gas supply line for allowing the additional gas from the additional gas supply unit to flow therein;

a first additional gas branch line branched from the additional gas supply line to be connected to with the first processing gas branch line at a downstream side of the branch flow control unit;

a second additional gas branch line branched from the additional gas supply line to be connected to with the second processing gas branch line at a downstream side of the branch flow control unit; and a flow path switching unit for switching a flow path of the additional gas from the additional gas supply line between the first and the second additional gas branch line, wherein the first electrode includes an electrode plate facing the second electrode; a support for supporting the electrode plate, wherein the support is in contact with a surface of the electrode plate and the surface is opposite to the second electrode; a hollow portion, provided on a contact surface of the support with the electrode plate, and having a shape in which a center portion thereof has a height different from that of an edge portion thereof; and a partition member for partitioning the hollow portion into a plurality of regions, each region belonging to one of the gas inlets.

In accordance with still another aspect of the present invention, there is provided a plasma processing apparatus for performing a specific plasma processing on a target substrate by disposing a first and a second electrode to face each other in a processing chamber; dividing the first electrode into a plurality of gas inlets; providing each gas inlet with a plurality of gas injection openings; and supplying high-frequency electric power to at least one of the first and the second electrodes to thereby generate a plasma while introducing a processing gas from each gas inlet onto the target substrate supported by the second electrode, the plasma processing apparatus including:

a processing gas supply unit for supplying the processing gas for processing the target substrate;

a processing gas supply line for allowing the processing gas from the processing gas supply unit to flow therein;

a plurality of branch lines branched from the processing gas supply line to be connected with the gas inlets, respectively;

a branch flow control unit for controlling branch flows of the processing gas distributed from the processing gas supply line to the branch lines based on inner pressures of the branch lines, respectively;

a plurality of additional gas supply units for supplying an additional gas; and an additional gas supply line, joining the branch lines at a downstream side of the branch flow control unit, for allowing the additional gas from the additional gas supply units to flow therein, wherein the first electrode includes an electrode plate facing the second electrode; a support for supporting the electrode plate, wherein the support is in contact with a surface of the electrode plate and the surface is opposite to the second electrode; a hollow portion, provided on a contact surface of the support with the electrode plate, and having a shape in which a center portion thereof has a height different from that of an edge portion thereof; and a partition member for partitioning the hollow portion into a plurality of regions, each region belonging to one of the gas inlets.

In accordance with the present invention, the first electrode, capable of being applied to the plasma processing apparatus in which the gas from the processing gas supply unit is divided and supplied to the processing chamber through the plurality of gas inlets, is provided.

In accordance with the present invention, the non-uniformity of electric field distribution on the surface of the electrode can be further reduced over a large area from the center portion of the electrode to the edge portion thereof, and thus the plasma having extremely high uniformity can be generated.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Figure 1:
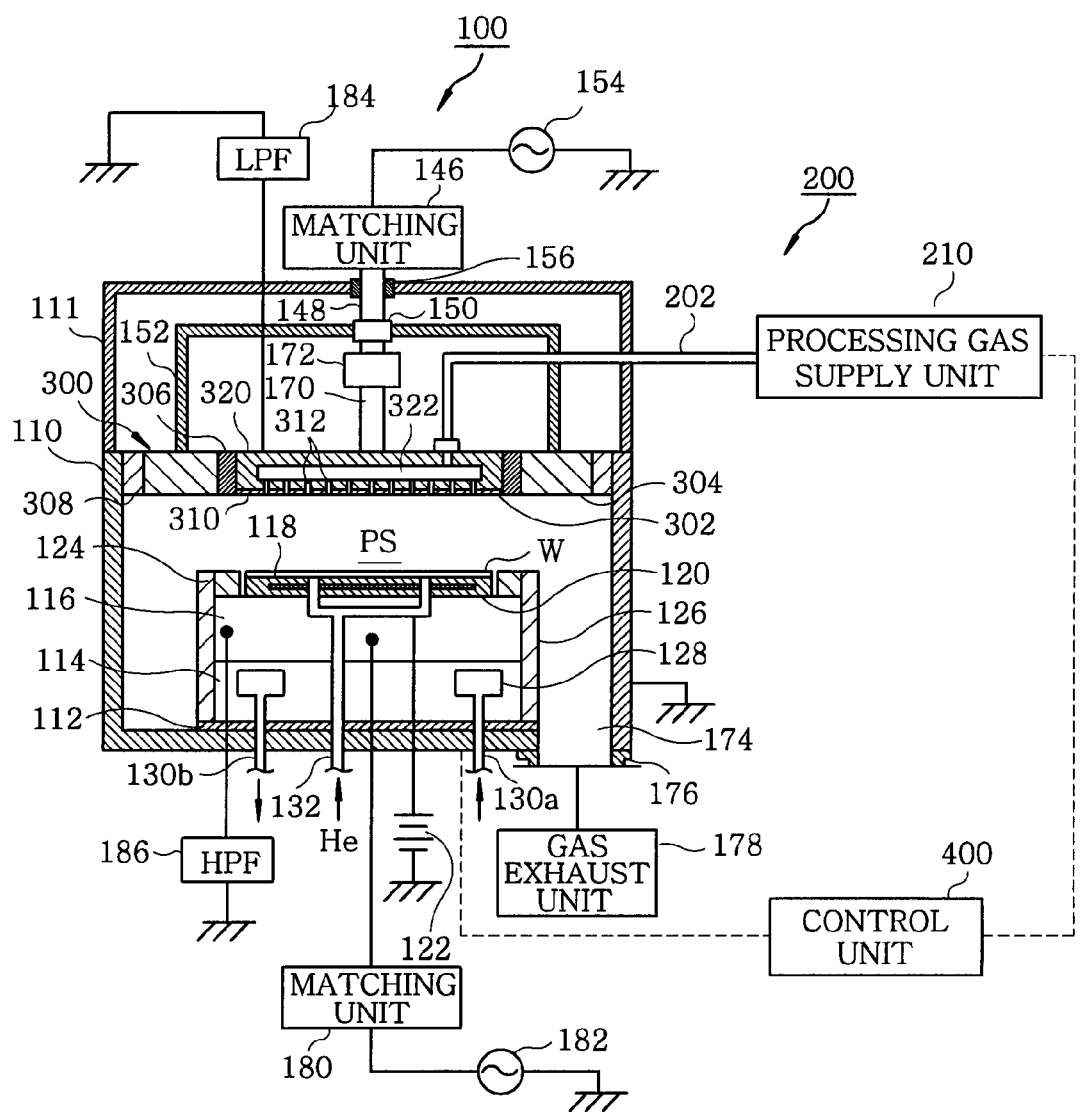
FIG. 1 is a cross sectional view showing a schematic configuration of a plasma processing apparatus in accordance with a first embodiment of the present invention.

Embodiments of the present invention will be described below in detail with reference to the drawings. Further, in the following description and the drawings, components having substantially the same functional constructions are denoted by like reference characters, and thus redundant description thereof will be omitted herein.

(Configuration Example of a Plasma Processing Apparatus According to a First Embodiment)

First, a plasma processing apparatus in accordance with a first embodiment of the present invention will be described with reference to the drawings. FIG. 1 is cross a sectional view showing a schematic configuration of a plasma processing apparatus in accordance with the first embodiment of the present invention. The plasma processing apparatus 100 in FIG. 1 is a parallel plate plasma etching apparatus having an upper electrode for introducing a gas into a processing chamber through a single line.

The plasma processing apparatus 100 has a processing chamber 110 has a processing vessel having a substantially cylindrical shape. The processing vessel is formed of, e.g., an aluminum alloy, and is electrically grounded. Further, an inner wall of the processing vessel is coated with alumina ($Al_2O_3$) or yttria ($Y_2O_3$).

The processing chamber 110 is provided therein with a susceptor 116, which forms a lower electrode as an example of a second electrode, serving also as a mounting table for mounting thereon a wafer W as a substrate. Specifically, the susceptor 116 is supported on a cylindrical susceptor support 114, which is provided at substantially the center of the bottom in the processing chamber 110 via an insulating plate 112. The susceptor 116 is formed of, e.g., an aluminum alloy.

The susceptor 116 is provided thereon with an electrostatic chuck 118 for holding the wafer W. The electrostatic chuck 118 is provided therein with an electrode 120. The electrode 120 is electrically connected with a DC (direct current) power supply 122. The electrostatic chuck 118 attracts the wafer W thereto by a Coulomb force generated when DC voltage from the DC power supply 122 is applied to the electrode 120.

A focus ring 124 is provided on an upper surface of the susceptor 116 to surround the electrostatic chuck 118. Further, a cylindrical inner wall member 126 formed of, e.g., quartz, is attached to the outer peripheral side of the electrostatic chuck 118 and the susceptor support 114.

The susceptor support 114 is provided therein with an annular coolant path 128. The coolant path 128 communicates with a chiller unit (not shown), installed outside the processing chamber 110, for example, via lines 130a and 130b. The coolant path 128 is supplied with coolant (cooling liquid or cooling water) circulating through the lines 130a and 130b. Thereby, the temperature of the wafer W mounted on the susceptor 116 can be controlled.

A gas supply line 132, which passes through the susceptor 116 and the susceptor support 114, communicates with an upper surface of the electrostatic chuck 118. A heat transfer gas (backside gas) such as He (helium) is supplied between the wafer W and the electrostatic chuck 118 via the gas supply line 132.

An upper electrode 300, which is an example of a first electrode, is provided above the susceptor 116 forming the lower electrode to face the susceptor 116 in parallel. The plasma generation space PS is defined between the susceptor 116 and the upper electrode 300.

The upper electrode 300 includes an inner upper electrode 302 having a disk shape, and an annular outer upper electrode 304 surrounding the outside of the inner upper electrode 302. The inner upper electrode 302 also functions as a processing gas inlet for injecting a specific amount of gas toward the plasma generation space PS on the wafer W mounted on the susceptor 116, and forms a shower head.

To be specific, the inner upper electrode 302 includes a circular electrode plate 310 having a plurality of gas injection openings 312, and an electrode support 320 detachably supporting the upper side of the electrode plate 310. The electrode support 320 is formed in the shape of a disk having substantially the same diameter as the electrode plate 310. The electrode support 320 is formed of, e.g., aluminum, and is provided therein with a buffer chamber 322, which is used for diffusing gas and has a space having a disk shape. The processing gas from a gas supply system 200 is introduced into the buffer chamber 322. Further, the buffer chamber 322 communicates with the gas injection openings 312 at a lower surface thereof. The configuration of the upper electrode 300 will be described later.

A dielectric 306 having a ring shape is interposed between the inner upper electrode 302 and the outer upper electrode 304. An insulating shield member 308, which has a ring shape and is formed of, e.g., alumina, is airtightly interposed between the outer upper electrode 304 and the inner peripheral wall of the processing chamber 110.

The outer upper electrode 304 is electrically connected with a first high-frequency power supply 154 via a power feeder 152, a connector 150, an upper power feed rod 148, and a matching unit 146. The first high-frequency power supply 154 can output a high-frequency voltage having a frequency of 40 MHz or higher (e.g. 60 MHz).

The power feeder 152 is formed into, e.g., a substantially cylindrical shape having an open lower surface, and is connected to the outer upper electrode 304 at the lower end portion thereof. The power feeder 152 is electrically connected with the lower end portion of the upper power feed rod 148 at the center portion of the upper surface thereof by means of the connector 150. The upper power feed rod 148 is connected to the output side of the matching unit 146 at the upper end portion thereof. The matching unit 146 is connected to the first high-frequency power supply 154, and can match load impedance with the internal impedance of the first high-frequency power supply 154.

The power feeder 152 is covered on the outside thereof by a cylindrical ground conductor 111 having a sidewall whose diameter is substantially the same as that of the processing chamber 110. The ground conductor 111 is connected to the upper portion of a sidewall of the processing chamber 110 at the lower end portion thereof. The upper power feed rod 148 passes through the center portion of the upper surface of the ground conductor 111. An insulating member 156 is interposed at the contact portion between the ground conductor 111 and the upper power feeder rod 148.

The electrode support 320 is electrically connected with the lower power feed rod 170 on the upper surface thereof. The lower power feed rod 170 is connected to the upper power feed rod 148 via the connector 150. The upper and the lower power feed rod 148 and 170 form a power feed rod for supplying the high-frequency electric power from the first high-frequency power supply 154 to the upper electrode 300 (hereinafter, simply referred to as "power feed rod 170"). A variable condenser 172 is provided in the lower power feed rod 170. By adjusting the capacitance of the variable condenser 172, when the high-frequency electric power is applied from the first high-frequency power supply 154, the relative ratio of an electric field strength formed directly under the outer upper electrode 304 to an electric field strength formed directly under the inner upper electrode 302 can be adjusted.

A gas exhaust port 174 is formed at the bottom portion of the processing chamber 110. The gas exhaust port 174 is connected to a gas exhaust system 178 having, e.g., a vacuum pump, via a gas exhaust line 176. The gas exhaust system 178 evacuates the inside of the processing chamber 110 to thereby depressurize the inner pressure thereof up to the desired degree of vacuum.

The susceptor 116 is electrically connected with a second high-frequency power supply 182 via a matching unit 180. The second high-frequency power supply 182 can output a high-frequency voltage in a range from 2 MHz to 20 MHz, e.g., 2 MHz.

The inner upper electrode 302 of the upper electrode 300 is electrically connected with an LPF (low pass filter) 184. The LPF 184 blocks high frequencies from the first high-frequency power supply 154 while passing high frequencies from the second high-frequency power supply 182 to the ground. Meanwhile, the susceptor 116 forming the lower electrode is electrically connected with an HPF (high pass filter) 186. The HPF 186 passes high frequencies from the first high-frequency power supply 154 to the ground.

The gas supply system 200 supplying the gas to the upper electrode 300 includes, e.g., a processing gas supply unit 210 supplying a processing gas for performing specific processes, such as film-forming, etching and the like, on the wafer, as shown in FIG. 1. The processing gas supply unit 210 is connected with a processing gas supply line 202 forming a processing gas supply path. The processing gas supply line 202 is connected to the buffer chamber 322 of the inner upper electrode 302.

The plasma processing apparatus 100 is connected with a control unit 400 that controls each component of the plasma processing apparatus 100. For example, the control unit 400 controls the DC power supply 122, the first high-frequency power supply 154, the second high-frequency power supply 182, etc. in addition to the processing gas supply unit 210, etc. of the gas supply system 200.

(Configuration of Upper Electrode)

Figure 2:
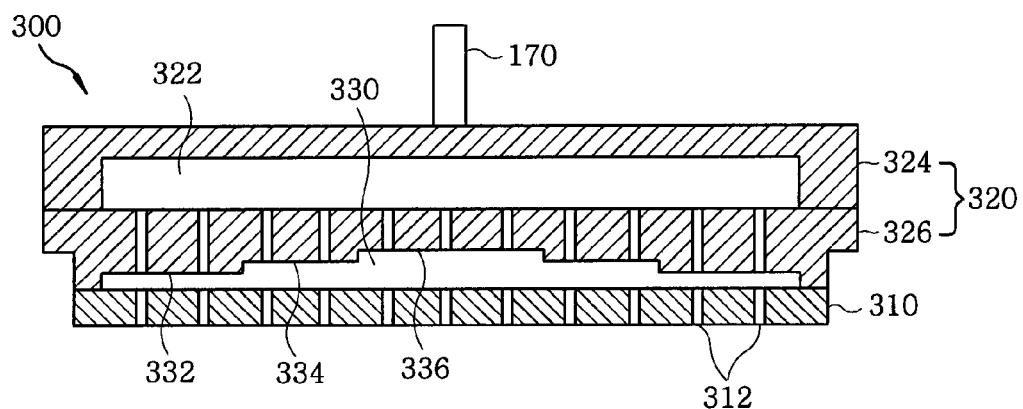
FIG. 2 is a schematic view showing a configuration of an upper electrode in accordance with the first embodiment of the present embodiment.

Here, a configuration of the upper electrode 300 will be described in detail with reference to the drawings. FIG. 2 is a schematic view showing a configuration of the inner upper electrode 302 of the upper electrode 300 in accordance with the present embodiment.

As shown in FIG. 2, the inner upper electrode 302 includes the electrode plate 310 facing the susceptor 116 forming the lower electrode; and the electrode support 320, in contact with a surface of the electrode plate 310 opposite to the susceptor 116 (here, the rear surface of the electrode plate), and detachably supporting the electrode plate 310.

Further, the electrode support 320 may be divided into an upper member 324 and a cooling plate 326 disposed under the upper member 324, for example, as shown in FIG. 2. In this case, the upper member 324 may be provided therein with a cooling jacket (not shown) through which a coolant circulates to thereby control a temperature of the electrode plate 310 at a desired temperature via the cooling plate 326. Further, the electrode support 320 may be formed in a single body.

The electrode support 320 is provided therein with a hollow portion 330 (a relative dielectric constant=1), as an example of a dielectric portion, the center portion of which has a height (thickness) different from that of the edge portion thereof and is in contact with the rear side of the electrode plate 310. The height of the hollow portion 330 is gradually increased as going from the edge portion toward the center portion thereof. For example, the hollow portion 330 has a shape in which a plurality of (e.g. three) disk-like hollow portions, each of which has a different diameter, are stacked in a multi-stage arrangement, wherein the diameters of the disk-like hollow portion are gradually reduced as going from the side in contact with the electrode plate 310 toward the opposite side (here, the rear side) of the electrode support 320.

Figure 3:
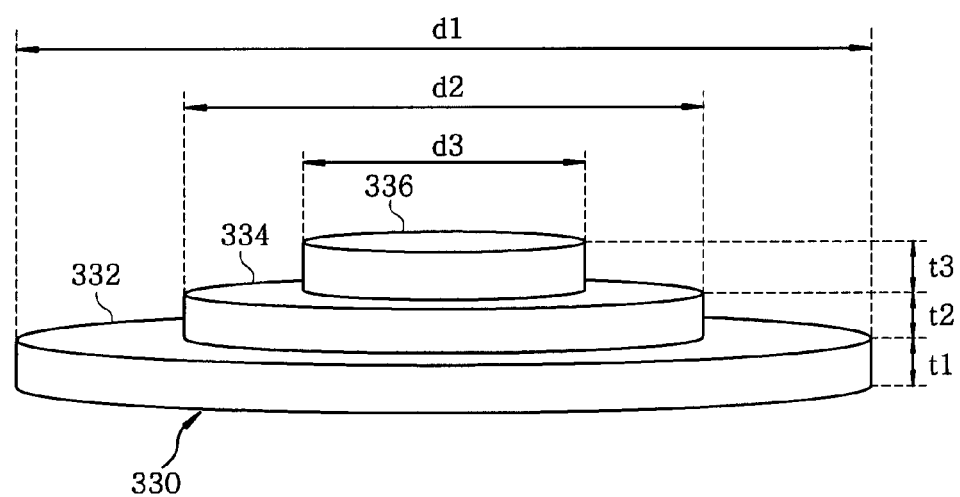
FIG. 3 is a schematic view showing a hollow portion of FIG. 2.

The hollow portion 330 is separated and schematically shown in FIG. 3. As shown in FIG. 3, the hollow portion 330 has the shape achieved by stacking three disk-like hollow portions 332, 334 and 336. Here, the three disk-like hollow portions 332, 334 and 336 are referred to as a first, a second and a third disk-like hollow portion 332, 334 and 336, respectively, in an order of being disposed near to the electrode plate 310. Assuming that the diameters of the three disk-like hollow portions 332, 334 and 336 are set to be d1, d2 and d3, respectively, the diameters d1, d2 and d3 have a relationship of d1>d2>d3. The thicknesses (heights) of the three disk-like hollow portions 332, 334 and 336 are set to be t1, t2 and t3, respectively. Since the hollow portion 330 functions as a dielectric (relative dielectric constant=1), the thicknesses t1, t2 and t3 may be represented by, e.g., multiples of the dielectric constant.

The hollow portion 330 functions as a dielectric (relative dielectric constant=1), and a resonance occurs at the frequency of the high-frequency electric power supplied to the upper electrode 300. Further, the dimensions (diameters and heights) of each of the disk-like hollow portions 332, 334 and 336 are determined such that an electric field perpendicular to the electrode plate 310 is generated. In this manner, when the resonance occurs in the hollow portion 330 to generate the electric field perpendicular to the electrode plate 310, the electric field of the hollow portion 330 is combined with that of the electrode plate 310, so that the electric field of the electrode plate 310, which is generated directly under the hollow portion 330 (e.g. from the center portion to the edge portion of the electrode), can be controlled by the electric field of the hollow portion 330.

Further, the dielectric portion may be formed by burying a dielectric member, which has the same shape as the hollow portion 330, in the hollow portion 330. Accordingly, since the dielectric constant of the dielectric portion is determined by that of the dielectric member, the dielectric constant of the dielectric portion can be set to be a desired value by selecting the dielectric member. Preferably, the dielectric member has a relative dielectric constant in a range from 1 to 10. Examples of materials having a relative dielectric constant within this range include quartz (relative dielectric constant between 3 and 10), ceramics such as alumina or aluminum nitride (relative dielectric constant between 5 and 10), and resin such as Teflon® or polyimide (relative dielectric constant between 2 and 3). The dielectric member may be formed in a single body, or by stacking, for example, a plurality of disk-like dielectric members matched with the dimensions of the disk-like hollow portions 332, 334 and 336.

Further, as described above, in order to combine the electric field of the dielectric portion formed with the hollow portion 330 or the dielectric member with the electric field of the electrode plate 310, the electrode plate 310 is preferably formed such that the thickness of the electrode plate 310 from the electrode plate surface (the lower surface of the electrode plate) at the portion to which the high-frequency electric power is supplied, i.e. the skin depth δ, following the following Equation 1-1 below, is greater than the thickness of the electrode plate 310.

$$\delta = (2\rho/\omega\mu)^{1/2}$$ Equation 1-1

In Equation 1-1, $\omega$ is the angular frequency (=$2\pi f$, f: frequency) of the high-frequency electric power, $\rho$ is the resistivity of the electrode plate, and $\mu$ is the magnetic permeability of the electrode plate.

The electrode plate 310 is formed of a conductor or a semiconductor, such as Si or SiC. Meanwhile, since the skin depth δ increases with an increase of the resistance of the electrode plate 310, the resistivity of the electrode plate 310 is preferably 0.5 Ω·m or more in view of making the skin depth δ greater than the thickness of the electrode plate 310, and more preferably 0.75 Ω·m. In this manner, in order to make the resistance of the electrode plate 310 relatively high, the amount of dopant, such as B (boron), is, for example, adjusted in case the electrode plate 310 is formed of Si, and the pressure at the time of sintering, for example, is adjusted in case the electrode plate 310 is formed of SiC.

When the skin depth δ is greater than the thickness of the electrode plate 310, the electric field penetrates the electrode plate 310. For example, under conditions such that the frequency of the high-frequency electric power is 60 MHz and the thickness of the electrode plate 310 is 10 mm, the skin depth δ becomes 10 mm or more when the specific resistance is 0.1 Ω·m or more. At this time, the hollow portion (dielectric member) 330 is surrounded by a conductor. In this manner, when the dielectric surrounded by the conductor exists, the resonance occurs at the frequency determined by the dimensions and the dielectric constant of the dielectric. Further, the hollow portion 330 functions as a dielectric having a relative dielectric constant of 1, and a resonance occurs at the frequency determined by the dimensions of the hollow portion 330.

For example, when the hollow portion 330 is a one-stage disk-like hollow portion, the resonance frequency is determined by the radius and height of the disk-like hollow portion. Here, considering that a cylindrical hollow portion having height L and radius r is formed on the rear side of the electrode plate 310, the angular frequency $\omega_0$ at the resonance can be obtained from Equation 1-2.

$$(\omega_0/c)^2 = k_1^2 + n^2\pi^2/L^2 \qquad \text{Equation 1-2}$$

In Equation 1-2, c is the light velocity in the medium, and $k_1$ is obtained from the root of $Jm'(k_1r)=0$ in the TE (transverse electric) mode and from the root of $Jm(k_1r)=0$ in the TM (transverse magnetic) mode. Here, Jm is the Bessel function, and Jm' is the result of differentiation of the Bessel function.

When this is applied to the hollow portion 330, including a multistage disk-like hollow portion according to the present embodiment, e.g., to the three-stage disk-like hollow portion as shown in FIGS. 2 and 3, it is conjectured that a resonance occurs depending on the radius r and the height L from the electrode plate 310 in the respective disk-like hollow portions 332, 334 and 336 as shown in FIG. 3.

More specifically, for example, it is conjectured that a resonance corresponding to the radius r=d1/2 and the height L=t1 from the electrode plate 310 occurs when the first disk-like hollow portion 332 is provided; that a resonance corresponding to the radius r=d2/2 and the height L=t1+t2 from the electrode plate 310 occurs when the second disk-like hollow portion 334 is provided; and that a resonance corresponding to the radius r=d3/2 and the height L=t1+t2+t3 from the electrode plate 310 occurs when the third disk-like hollow portion 336 is provided.

For this reason, the electric field generated in the three-stage disk-like hollow portion is the sum of the electric fields generated by the resonances. When these resonances occur and thus electric fields perpendicular to the electrode plate 310 are generated, the electric field of the hollow portion 330 is combined with that of the electrode plate 310. Thus, the electric field generated in the hollow portion 330 can be more precisely controlled by adjusting the radius r and the height L from the electrode plate 310 in the respective disk-like hollow portions 332, 334 and 336, so that the electric field of the electrode plate 310 can be controlled in a large area directly under the hollow portion 330 (e.g. from the center portion to the edge portion of the electrode).

(Operation of Plasma Processing Apparatus)

Next, the operation of the plasma processing apparatus 100 including the above-described upper electrode 300 will now be described taking the case of etching an oxide film formed on the wafer W as an example. First, the wafer W is loaded into the processing chamber 110 from a load lock chamber (not shown), after a gate valve (not shown), is opened, and is mounted on the electrostatic chuck 118. Then, when the DC voltage is applied from the DC power supply 122, the wafer W is electrostatically attached to the electrostatic chuck 118. After that, the gate valve is closed, and the processing chamber 110 is evacuated to a specific vacuum level by the gas exhaust system 178.

Thereafter, the processing gas is introduced into the buffer chamber 322 in the upper electrode 300 from the processing gas supply unit 210 via the processing gas supply line 202 while the flow rate thereof is adjusted by, e.g., a mass flow controller. Further, the processing gas introduced into the buffer chamber 322 is uniformly discharged from the gas injection openings 312 of the electrode plate 310 to the wafer W, and then the inner pressure of the processing chamber 110 is maintained at a specific level.

High-frequency electric power in a range from 27 to 150 MHz, e.g., 60 MHz, is applied from the first high-frequency power supply 154 to the upper electrode 300. Thereby, a high-frequency electric field is generated between the upper electrode 300 and the susceptor 116, forming the lower electrode, and the processing gas is dissociated and converted into a plasma. A high frequency electric power in a range from 1 to 20 MHz, e.g., 2 MHz, is applied from the second high-frequency power supply 182 to the susceptor 116 forming the lower electrode. As a result, ions in the plasma are attracted toward the susceptor 116, and the anisotropy of etching is increased by ion assist. In this manner, by increasing the frequency of the high frequency electric power applied to the upper electrode 300 to be higher than 27 MHz, the plasma density can be increased.

On the other hand, when the hollow portion 330 is not provided on the rear side of the electrode plate, the electric field at the lower surface of the electrode plate 310 becomes non-uniform due to the influence of the inductance on the electrode surface in the diameter direction at the time of increasing applied frequency.

Figure 4:
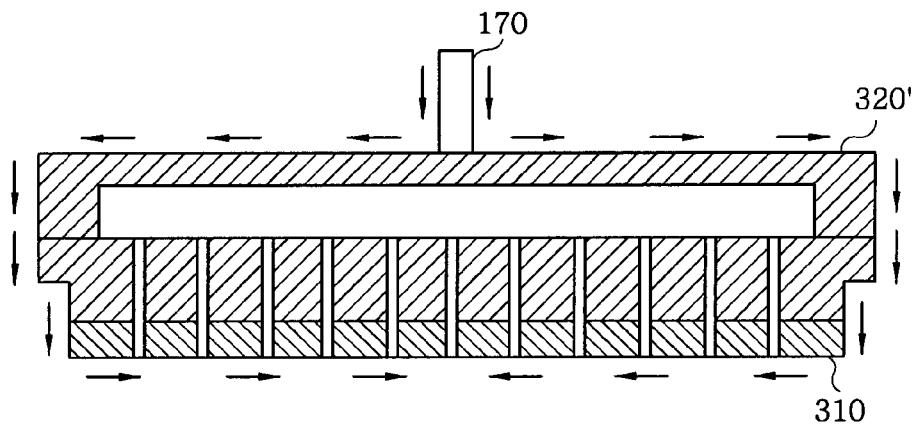
FIG. 4 is an explanatory view of an upper electrode in case a hollow portion is not provided.

The reason why such non-uniformity of the electric field is caused will be described with reference to the drawings. FIG. 4 is a schematic cross sectional view showing a path of supplying high-frequency electric power to the upper electrode in which no hollow portion is provided on the rear side of the electrode plate of an electrode support 320'. The electrode plate 310 has a resistivity of, e.g., about 0.02 $\Omega \cdot$m. When the high-frequency current supplied via the power feeder rod 170 is converted into a high frequency, the high-frequency electric power is supplied only to the surface of the electrode due to a skin effect. As shown in FIG. 4, the high-frequency electric power reaches the lower surface of the electrode plate 310, while a plasma contact surface, via the surface of the power feeder rod 170, the upper surface of the electrode support 320', lateral surfaces of the electrode support 320', and lateral surfaces of the electrode plate 310.

In this case, since the power feed rod 170 is placed at the center portion of the electrode, the electric power is in phase everywhere at the edge portion of the lower surface of the electrode plate 310. Further, because the electric power is gradually supplied from the edge portion of the electrode plate 310 toward the center portion thereof while being in phase, a phase difference r/$\lambda$ (here, $\lambda$ is the wavelength of the electrode surface wave, and r is the radius of the electrode) is generated between the center and the edge portion of the electrode plate 310. Hence, when the applied frequency becomes high, the inductance at the lower surface of the electrode plate 310 in the diameter direction becomes significant value, and thus the electric field strength at the center portion of the lower surface of the electrode plate 310 becomes higher than the electric field strength at the edge portion thereof due to the interference effect caused by the phase difference. Further, because the central position of the electrode plate 310 is in contact with the plasma, it serves as an open end in terms of a RF (radio frequency) equivalent circuit. Therefore, the electric field becomes stronger at the center portion of the lower surface of the electrode plate 310, and thus a non-uniformity of a standing wave form is generated in the electric field distribution. As a result, the electric field distribution supplied to the plasma becomes non-uniform, so that a non-uniform plasma is formed.

Figure 5:
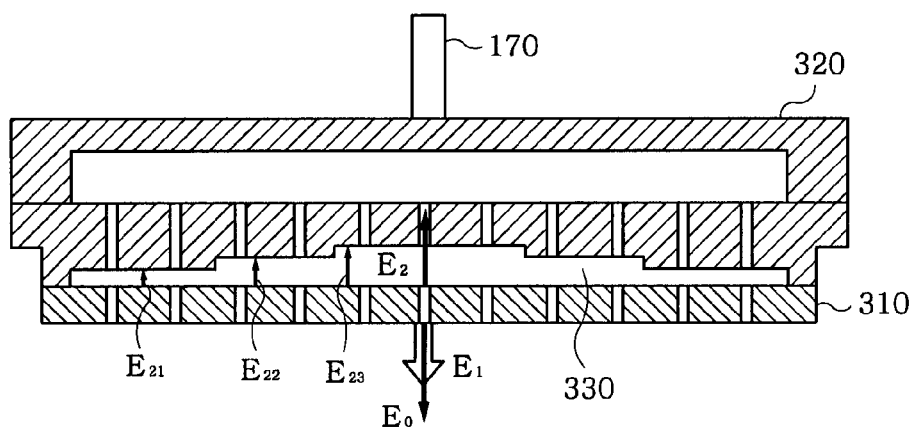
FIG. 5 is an explanatory view of electric field strengths of an electrode plate and a hollow portion.

In this respect, in the present embodiment, as shown in FIG. 5, the electrode support 320 is provided with the hollow portion 330 on its surface in contact with the electrode plate 310, so that the resonance occurs in the hollow portion 330 at the frequency of the high-frequency electric power supplied to the upper electrode 300, and the electric field perpendicular to the electrode plate 310 is generated in the hollow portion 330. Thereby, the electric field of the hollow portion 330 is combined with that of the electrode. Thus, the electric field of the electrode plate 310 under the hollow portion 330 can be controlled by the electric field of the hollow portion 330.

In this case, for example, as shown in FIG. 5, if it is assumed that the electric field strength of the surface of the electrode plate 310 when the hollow portion 330 is not provided is $E_0$, and that the electric field strength of the surface of the electrode plate 310 and the electric field strength generated in the hollow portion 330 when the hollow portion 330 is provided are $E_1$ and $E_2$, respectively, the electric field strengths can be algebraically expressed by: $E_1=E_0+E_2$. Further, the electric field strength $E_2$ generated in the hollow portion 330 is the sum of electric field strengths $E_{21}$, $E_{22}$, and $E_{23}$ generated by the resonances occurring according to the radii r and the heights L from the electrode plate 310 in the disk-like hollow portions 332, 334 and 336.

The electric field strength $E_2$ generated in the hollow portion 330 is dependent on the shape of the hollow portion 330, as described below. In the present embodiment, the center and the edge portion of the hollow portion 330 of the upper electrode 300 are different in height, and the height is gradually increased as going from the edge portion toward the center portion. Thus, the electric field of the electrode plate 310, which is formed under the hollow portion 330, can be controlled at the center portion of the electrode as well as in a large area from the center to the edge portion of the electrode.

(Relationship Between Shape of Hollow Portion of Rear Side of Electrode Plate and Distribution of Electric Field Strength)

Figure 6:
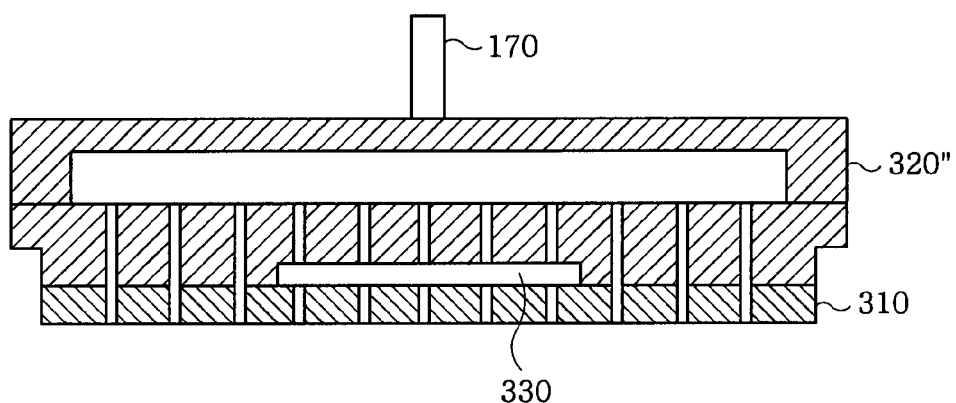
FIG. 6 is an explanatory view of an upper electrode in which a hollow portion has a single stage.

Here, test results of the relationship between the shape of the hollow portion 330 provided on the rear side of the electrode plate and the distribution of the electric fields directly under the electrode will be described. The description will be made by comparing the case in which the hollow portion 330 has a shape formed by stacking three disk-like hollow portions having different diameters (i.e. a three-stage hollow portion) (FIGS. 2 and 3), the case in which the hollow portion 330 has the shape of a single disk-like hollow portion (i.e. a singe-stage hollow portion) (FIGS. 6 and 7), and the case in which no hollow portion is provided (FIG. 4).

Figure 7:
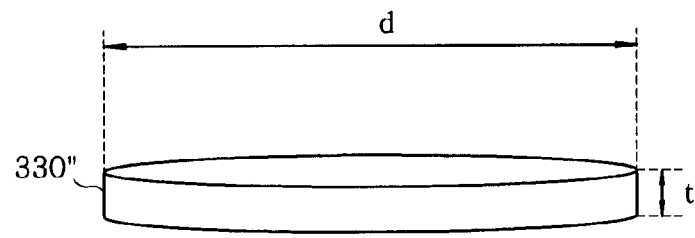
FIG. 7 is a schematic view showing the hollow portion of FIG. 6.

In this test, for the case of the single-stage hollow portion, the upper electrode having the hollow portion 330 whose height t and diameter d are 0.2 mm and 240 mm, respectively, as shown in FIG. 7, was used. Further, for the case of the three-stage hollow portion, the upper electrode having the hollow portion 330 whose first-stage, second-stage and third-stage height t1, t2 and t3 in FIG. 3 are 0.1 mm, 0.1 mm and 0.05 mm, respectively, and the first-stage, second-stage and third-stage diameter d1, d2 and d3 are 100 mm, 200 mm and 310 mm, respectively, was used.

Figure 8:
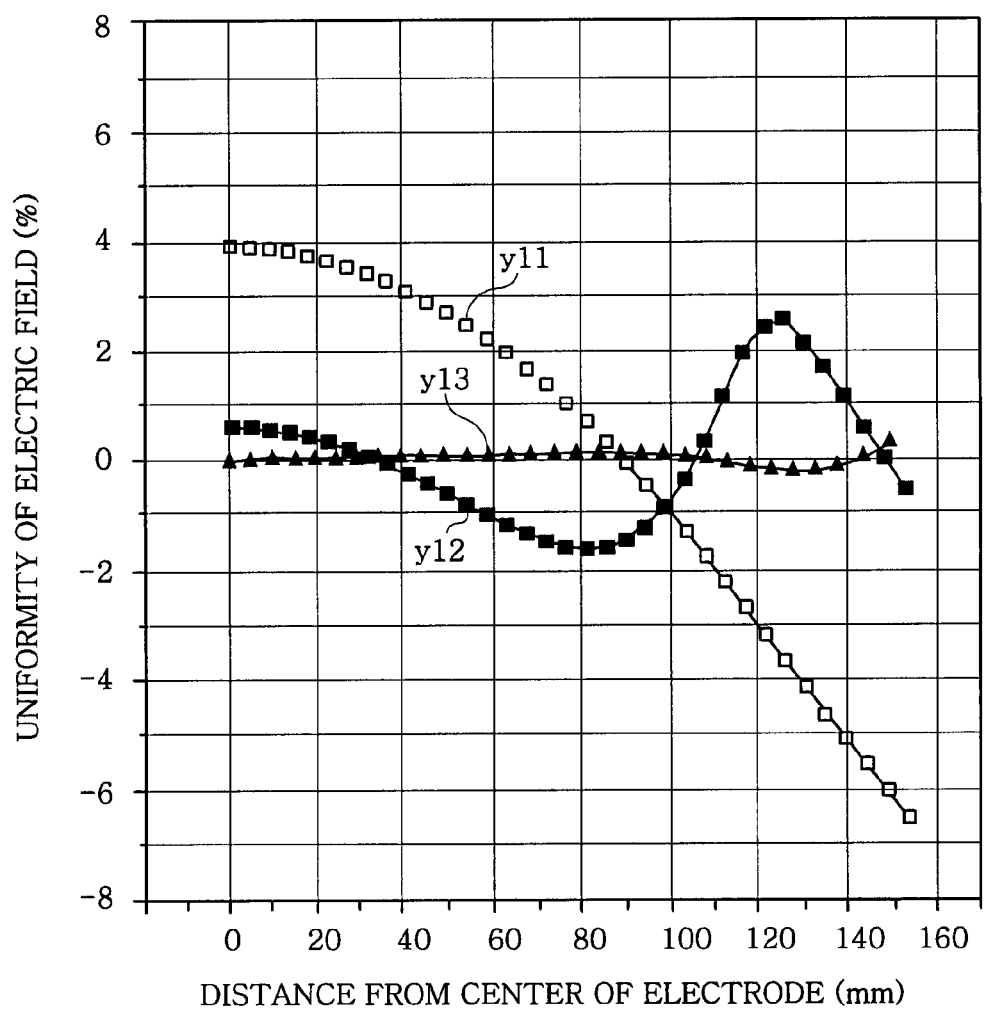
FIG. 8 illustrates strength distribution of electric fields generated at the lower side of an upper electrode.

The test results of applying the high-frequency electric power to the above-described upper electrode are shown in FIG. 8. The graphs y11, y12 and y13 in FIG. 8 show the distribution of electric field strengths in case of no hollow portion, the single-stage hollow portion and the three-stage hollow portion, respectively. In FIG. 8, the x-axis indicates the distance from the center of the electrode, and the y-axis indicates the uniformity of the electric field strength $E_1$ of the electrode plate in percentage.

According to the test results shown in FIG. 8, the case y12 of the single-stage hollow portion shows a tendency to have a low electric field directly under the center portion of the hollow portion and a high electric field directly under the edge portion of the hollow portion, compared to the case y11 in which there was no hollow portion. Accordingly, it can be conjectured that the uniformity is increased.

However, by comparing the uniformity of the electric field directly under the center portion of the hollow portion 330" in the case y12 of the single-stage hollow portion with the electric field directly under the edge portion of the hollow portion 330", it is noted that relatively high uniformity of about ±1% could be obtained directly under the center portion of the hollow portion (e.g. in a range from 0 mm to 60 mm), whereas a uniformity of about ±3% could be obtained directly under the edge portion of the hollow portion (e.g. in a range from 60 mm to 120 mm). It is inferred from this result that the uniformity of the edge portion is lower than that of the center portion. This is because a plurality of inflection points exists on the distribution curve of the electric field strength in the case of the single-stage hollow portion, and particularly because the slope at the inflection point directly under the vicinity of the edge portion of the single-stage hollow portion 330" shows a tendency toward relative increase.

The slope at each inflection point existing on this distribution curve of the electric field strength is varied by changing the dimensions, i.e. the height t and the diameter d of the single-stage hollow portion. Hence, it follows that the slope of each inflection point may be adjusted by adjusting the dimensions of the single-stage hollow portion. However, in the single-stage hollow portion, the adjustment of the height t and the diameter d has an influence on the uniformity of the electric field at the edge portion as well as the uniformity of the electric field at the center portion. For example, when an attempt is made to further increase the uniformity of the electric field at the edge portion, the uniformity of the electric field at the center portion shows a tendency to decrease. For this reason, the adjustment of the dimensions of the single-stage hollow portion alone has a limitation in realizing a further increase in the uniformity of the electric field at the edge portion of the electrode while maintaining the uniformity of the electric field at the center portion of the electrode.

In contrast, because almost no inflection points exist on the distribution curve of the electric field strength in the case y13 of the three-stage hollow portion, it is possible to obtain extremely high uniformity of ±0.5% over a large area from the center to the edge of the hollow portion 330. In this manner, it can be found that, by making the height of the center portion is different from that of the edge portion in the hollow portion 330 has a shape like the above-described hollow portion 330 (e.g. the three-stage hollow portion), it is possible to reduce the inflection points as well as the slope at each inflection point on the distribution curve of the electric field strength, and as a result, the influence of the inflection point can be greatly lowered. Thereby, in the electrode plate 310, the electric field distribution at the lower side of the hollow portion 330 can be controlled at the center portion of the electrode as well as in a large area from the center to the edge of the electrode, and thus a plasma having extremely high uniformity can be formed in a large area.

Here, the test results of actually etching the wafer by using the above-described upper electrode will be described. In this test, plasma processing apparatus 100 in FIG. 1, in which the resistivity of the electrode plate 310 was set to 0.75 Ω·m was employed and the oxide layer of the wafer of 300 mm was etched with a gas mixture of $C_5F_8$, Ar and $O_2$. The frequency of the high-frequency electric power was set to 60 MHz.

Figure 9:
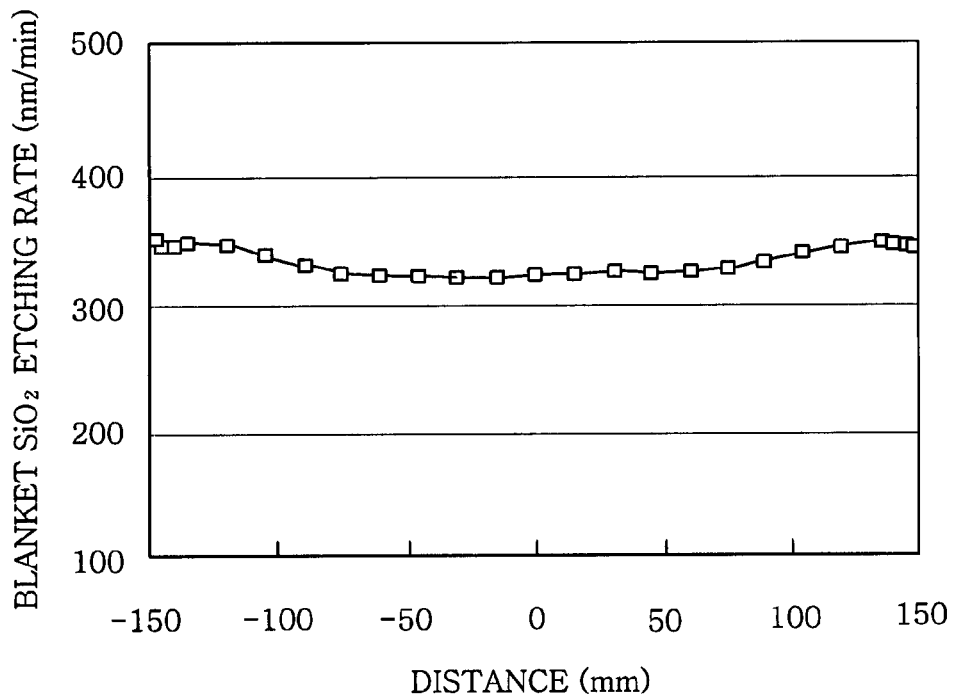
FIG. 9 illustrates distribution of etching rates in case of etching a wafer by using an upper electrode having a single-stage hollow portion on the rear side of an electrode plate.
Figure 10:
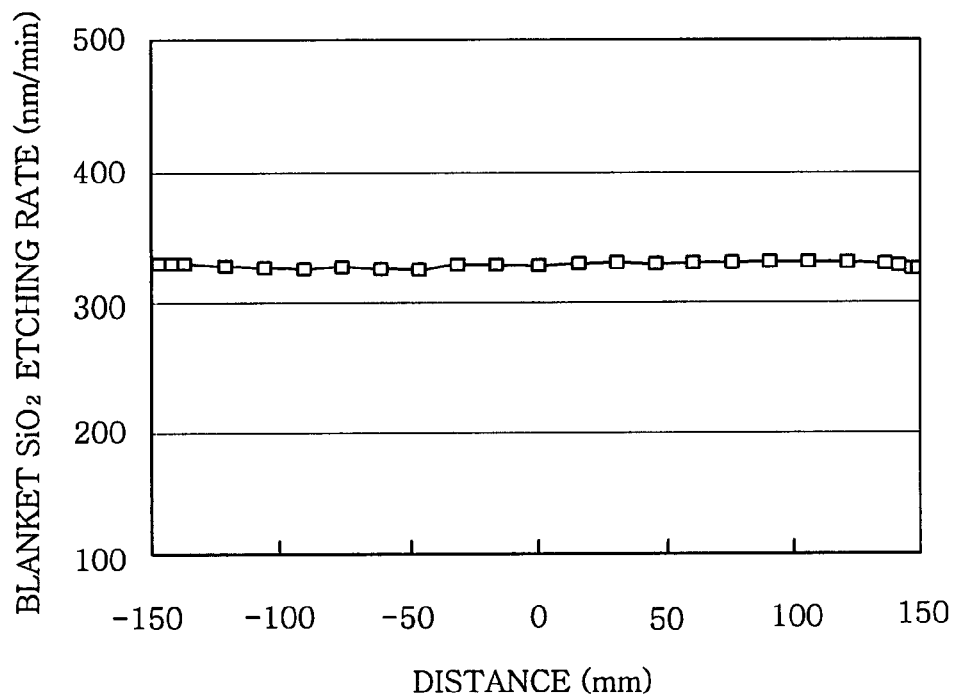
FIG. 10 illustrates distribution of etching rates in case of etching a wafer by using an upper electrode having a three-stage hollow portion on the rear side of an electrode plate.

FIG. 9 illustrates the distribution of etching rates in case of etching a wafer by using an upper electrode having a single-stage hollow portion on the rear side of an electrode plate. FIG. 10 illustrates the distribution of etching rates in case of etching a wafer by using an upper electrode having a three-stage hollow portion on the rear side of an electrode plate. It can be found from these drawings that the uniformity in the case of the three-stage hollow portion (FIG. 10) is further increased over that in the case of the single-stage hollow portion (FIG. 9).

Further, in the configuration example of the upper electrode 300 of the present embodiment has described the case of forming the three-stage hollow portion 330 at the electrode support 320, but the invention is not necessarily limited to this configuration. For example, the number of stages of the hollow portion 330 formed at the electrode support 320 may be two, or four or more.

(Relationship Between Number of Stages of Hollow Portion on Rear Side of Electrode Plate and Distribution of Electric Field Strength)

Here, a description will be made regarding the results of determining the relationship between the number of stages of the hollow portion 330 formed at the upper electrode 300 and the distribution of the electric field strengths directly under the electrode. Here, the description will made by comparing the case of the single-stage hollow portion shown in FIG. 11, the case of the two-stage hollow portion shown in FIG. 12, and the case of the three-stage hollow portion shown in FIG. 13.

Figure 11:
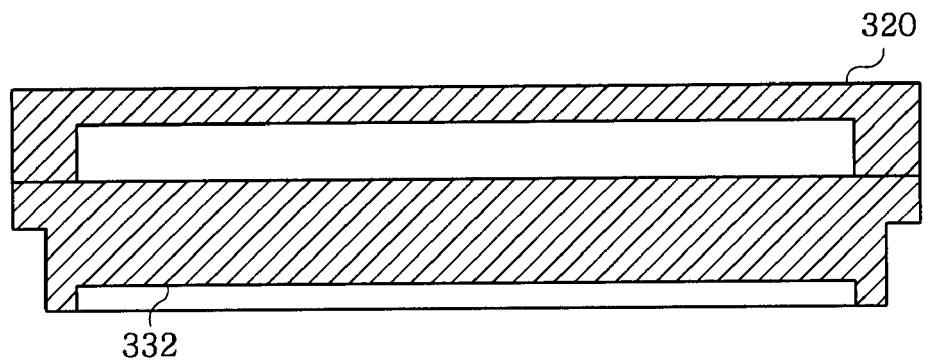
FIG. 11 illustrates an electrode support in which only the first stage in the three-stage hollow portion of FIG. 3 is formed.
Figure 12:
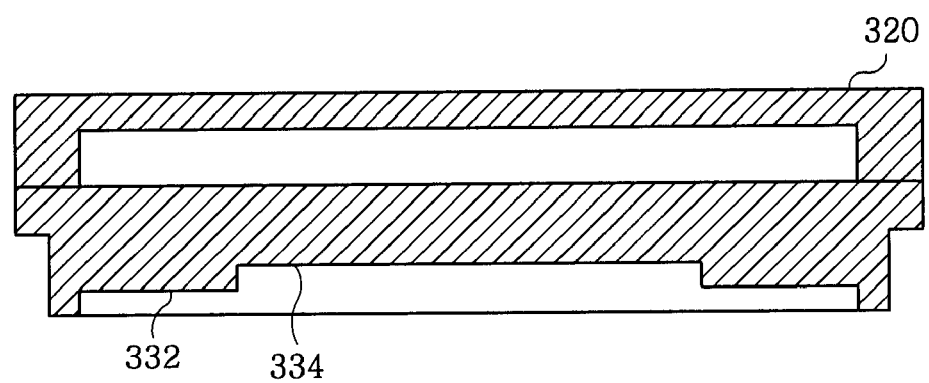
FIG. 12 illustrates an electrode support in which only the first and the second stage in the three-stage hollow portion of FIG. 3 is formed.
Figure 13:
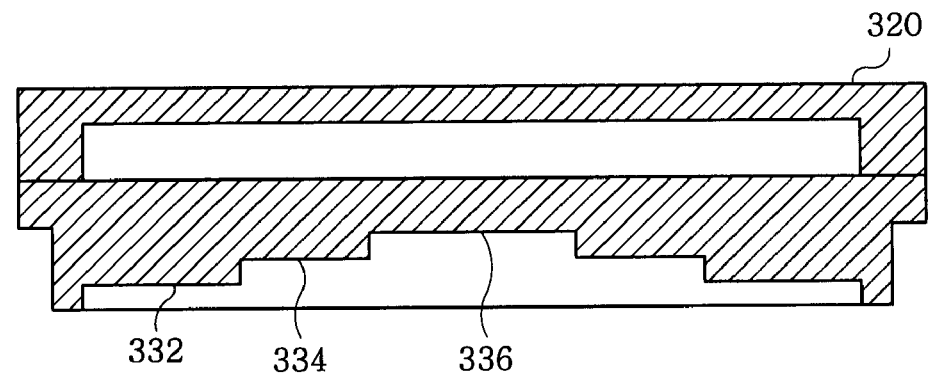
FIG. 13 illustrates an electrode support in which the first, the second and the third stage in the three-stage hollow portion of FIG. 3 are formed.

In this test, the dimensions of the disk-like hollow portions of the upper electrodes shown in FIGS. 11 to 13 are the same as those of the first, the second and the third stage of the hollow portion 330 shown in FIG. 3, respectively. That is, the heights t1, t2 and t3 are 0.1 mm, 0.1 mm and 0.05 mm, respectively, and the diameters d1, d2 and d3 are 100 mm, 200 mm and 310 mm, respectively.

Figure 14:
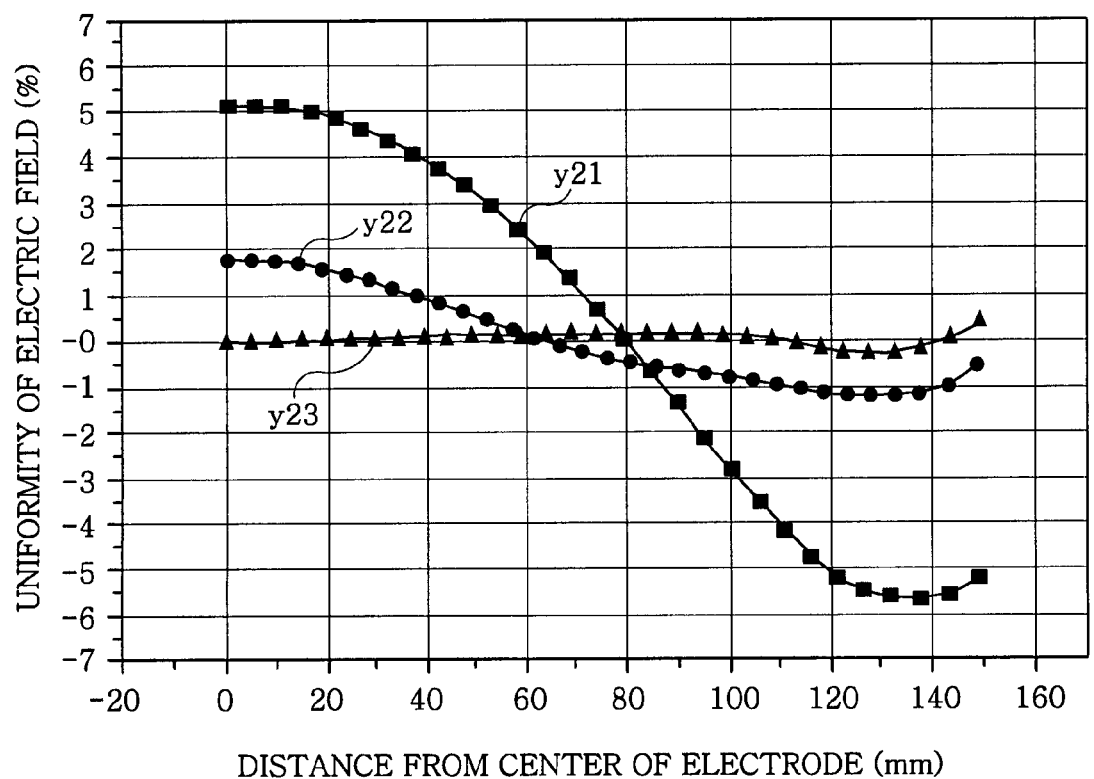
FIG. 14 illustrates the relationship between the number of stages of a hollow portion and the strength distribution of electric fields generated at the lower side of an upper electrode.

The test results of applying the high-frequency electric power to the upper electrode as described above are shown in FIG. 14. The graphs y21, y22 and y23 shown in FIG. 14 show the distribution of electric field strengths in the case of the single-stage hollow portion, in case of the two-stage hollow portion, and in case of the three-stage hollow portion, respectively. In FIG. 14, the x-axis indicates the distance from the center of the electrode, and the y-axis indicates the uniformity of the electric field strength $E_1$ of the electrode plate in percentage.

According to the test results shown in FIG. 8, it can be found that, as the number of stages of the hollow portion increases in an order of the case y21 of the single-stage hollow portion, the case y22 of the two-stage hollow portion, and the case y23 of the three-stage hollow portion, the number of inflection points on a distribution curve of the electric fields are reduced; the slope at each inflection point is decreased; and the uniformities of the electric fields are increased to be ±6%, ±2% and ±0.5%, respectively. In this case, preferably, the diameters d1, d2 and d3 of the stages are gradually reduced as going away from the electrode plate 310. In this manner, by making a shape of the hollow portion such that the center portion thereof is high and the edge portion thereof is low, the influence of the inflection points on the electric field distribution curve can be reduced.

In this manner, the electric field distribution directly under the electrode can be more precisely controlled in proportion to the number of stages of the hollow portion 330 formed at the upper electrode, so that the uniformity of the electric field can be increased. However, in consideration of the efforts for forming the hollow portion 330 and the degree of freedom of the dimensions (height t and diameter d) of each stage of the hollow portion 330, it is more preferable that the hollow portion 330 is formed to have three stages.

Preferably, the diameters d1, d2 and d3 of the three-stage hollow portion 330 are in ranges from 80% to 120%, from 60% to 80%, and from 40% to 60% of the diameter of the wafer, respectively, and more preferably, in ranges from 90% to 110%, from 65% to 75%, and from 45% to 55% thereof, respectively. Further, preferably, in the case the relative dielectric constant is, e.g., 1, the heights t1, t2 and t3 of the three-stage hollow portion 330 are in ranges from 0.08 mm to 0.16 mm, from 0.08 mm to 0.12 mm, and from 0.03 mm to 0.09 mm, respectively, and more preferably, in ranges from 0.10 mm to 0.12 mm, from 0.09 mm to 0.11 mm, and from 0.05 mm to 0.07 mm, respectively.

(Diameter of First Stage of Hollow Portion)

Further, in the present embodiment, the diameter of the first stage of the hollow portion may be smaller than that (e.g. 300 mm) of the wafer, or may be similar to or greater than that of the wafer. In this respect, when the diameter of the hollow portion having only one stage is greater than that of the wafer, the electric field tends to move in the positive direction at the center portion and in the negative direction at the edge portion, so that the uniformity of the electric field is reduced. For example, the electric field distribution curve is the graph y12 in FIG. 8 in case where the diameter is 240 mm, whereas it is the graph y21 in FIG. 14 in case where the diameter is 310 mm. As a result, the uniformity of the electric field is reduced.

In contrast, in the hollow portion stacking a plurality of stages, by making the diameter of the first stage greater than that of the wafer, the electric field distribution can be controlled in a large area from the center to the edge, so that the uniformity of the plasma formed on the wafer can be further improved.

However, at the gas injection openings 312 of the upper electrode, as the applied high-frequency electric power becomes stronger, the possibility of generating abnormal discharge becomes higher, because the electric field is concentrated near the boundary between the electrode plate 310 and the electrode support 320. This abnormal discharge is hardly generated if the hollow portion 330 exists between the electrode plate 310 and the electrode support 320. Hence, from the viewpoint of preventing abnormal discharge, it is preferable that the diameter of the hollow portion 330 is set to be greater than the diameter of the wafer to cover the area in which the gas injection openings 312 are formed. In this respect, if the diameter of the hollow portion having only one stage is increased the uniformity of the electric field distribution is decreased.

In contrast, in the hollow portion 330 having the plurality of stages stacked, although the diameter of the first stage is increased to cover the area in which the gas injection openings 312 are formed, the electric field distribution can be controlled over a large area from the center to the edge. Therefore, the uniformity of the electric field distribution can be increased while preventing abnormal discharge.

(Configuration Example of Plasma Processing Apparatus According to Second Embodiment)

Figure 15:
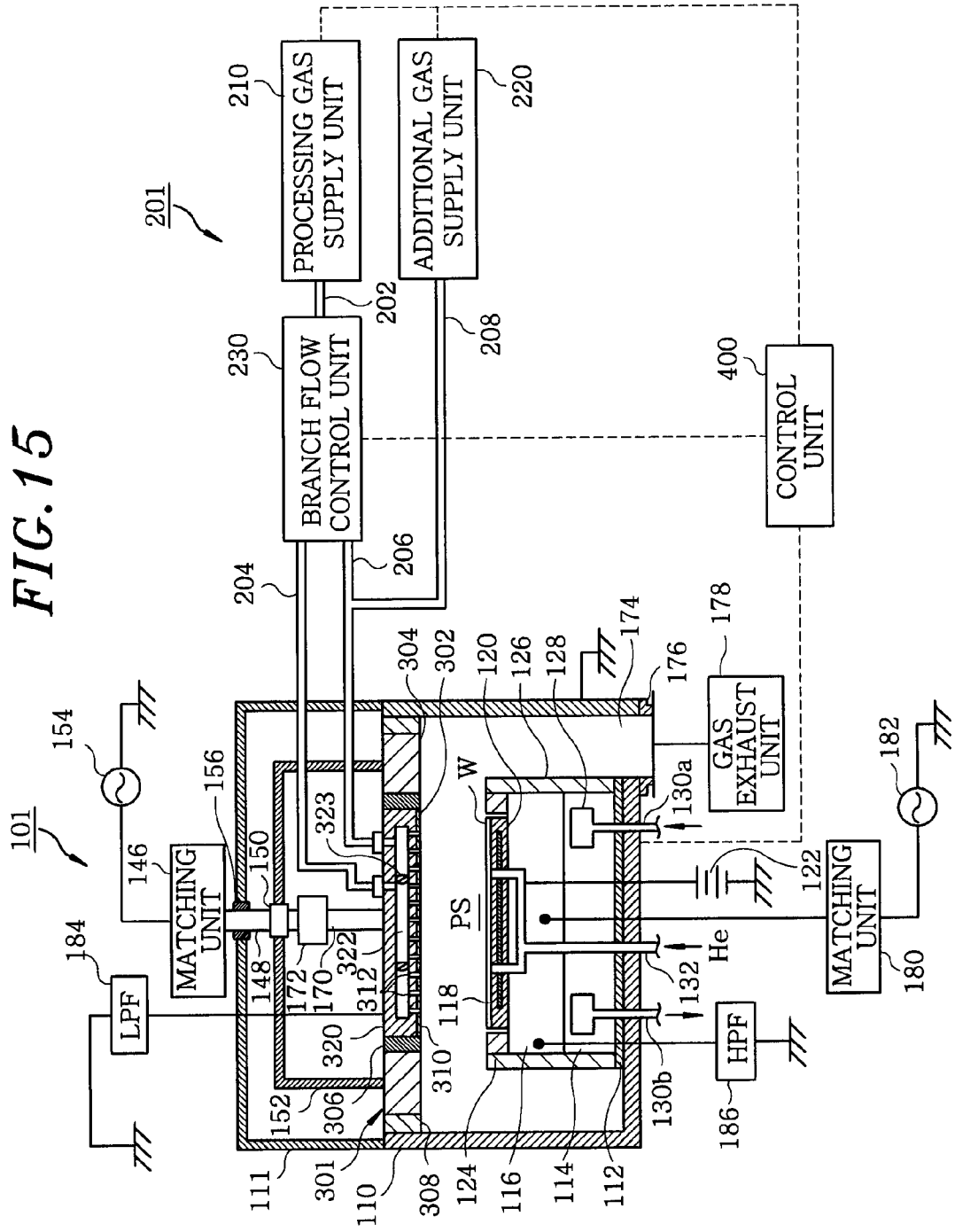
FIG. 15 is a cross sectional view showing a configuration of a plasma processing apparatus in accordance with a second embodiment of the present invention.

Next, a plasma processing apparatus in accordance with a second embodiment of the present invention will be described with reference to the drawings. FIG. 15 is a cross sectional view showing a schematic configuration of a plasma processing apparatus in accordance with the second embodiment of the present invention. A plasma processing apparatus 101 shown in FIG. 15 is a parallel plate plasma etching apparatus having an upper electrode for introducing a gas into a processing chamber via two lines.

In the second embodiment, an inner upper electrode 302 of the upper electrode 301 is divided into a first and a second gas inlet 350 and 360. The first and the second gas inlet 350 and 360 serve to introduce the gas toward a first and a second region, respectively, on a wafer W mounted on a susceptor 116. The first region is a region, e.g., at the center portion of the wafer W (hereinafter, referred to as "center region"), and the second region is a region, e.g., at the edge portion of the wafer surrounding the center portion of the wafer (hereinafter, referred to as "edge region"). A detailed configuration of the upper electrode 301 will be described later.

In a gas supply system 201 for supplying the gas to the upper electrode 301, a processing gas is divided into two gases: a first processing gas (a processing gas for the center region) supplied toward the center region of the wafer W in a processing chamber 110, and a second processing gas (a processing gas for the edge region) supplied toward the edge region of the wafer W. Further, the processing gas is not limited to the case in which it is divided into two gases as in the present embodiment, and thus may be divided into three or more gases.

As shown in FIG. 15, the gas supply system 201 includes, for example, a processing gas supply unit 210 that supplies the processing gas for performing specific processes, such as film-forming, etching and the like, on the wafer, and an additional gas supply unit 220 that supplies a specific additional gas. The processing gas supply unit 210 is connected with a processing gas supply line 202 forming a processing gas supply path, and the additional gas supply unit 220 is connected with an additional gas supply line 208 forming an additional gas supply path. A first branch line 204 forming a first branch path and a second branch line 206 forming a second branch path are branched from the processing gas supply line 202. Further, the first and second branch lines 204 and 206 may be branched from the inside of a branch flow control unit 230 or from the outside of the branch flow control unit 230.

The first and the second branch line 204 and 206 are connected to, e.g., the first and the second gas inlet 350 and 360 in the inner upper electrode 302, respectively. Specifically, the first branch line 204 is connected to a first buffer chamber 352 of the first gas inlet 350, and the second branch line 206 is connected to a second buffer chamber 362 of the second gas inlet 360.

Further, the gas supply system 201 includes the branch flow control unit 230 (e.g. a flow splitter), which controls branch flows of the first and the second processing gas flowing through the first and the second branch line 204 and 206 based on inner pressures of the first and the second branch line 204 and 206. Further, the additional gas supply unit 220 is connected to the second branch line 206 via the additional gas supply line 208, at downstream side of the branch flow control unit 230.

In this gas supply system 201, the branch flow of the processing gas from the processing gas supply unit 210 is adjusted by the branch flow control unit 230, and the gas is then distributed into the first branch line 204 and the second branch line 206. The first processing gas flowing through the first branch line 204 is supplied toward the center region of the wafer W through the first gas inlet 350. The second processing gas flowing through the second branch line 206 is supplied toward the edge region of the wafer W through the second gas inlet 360.

At this time, when the additional gas is supplied from the additional gas supply unit 220, it flows to the second branch line 206 via the additional gas supply line 208, and then is mixed with the second processing gas to be supplied toward the edge region of the wafer W through the second gas inlet 360.

(Detailed Configuration Example of Gas Supply System)

Figure 16:
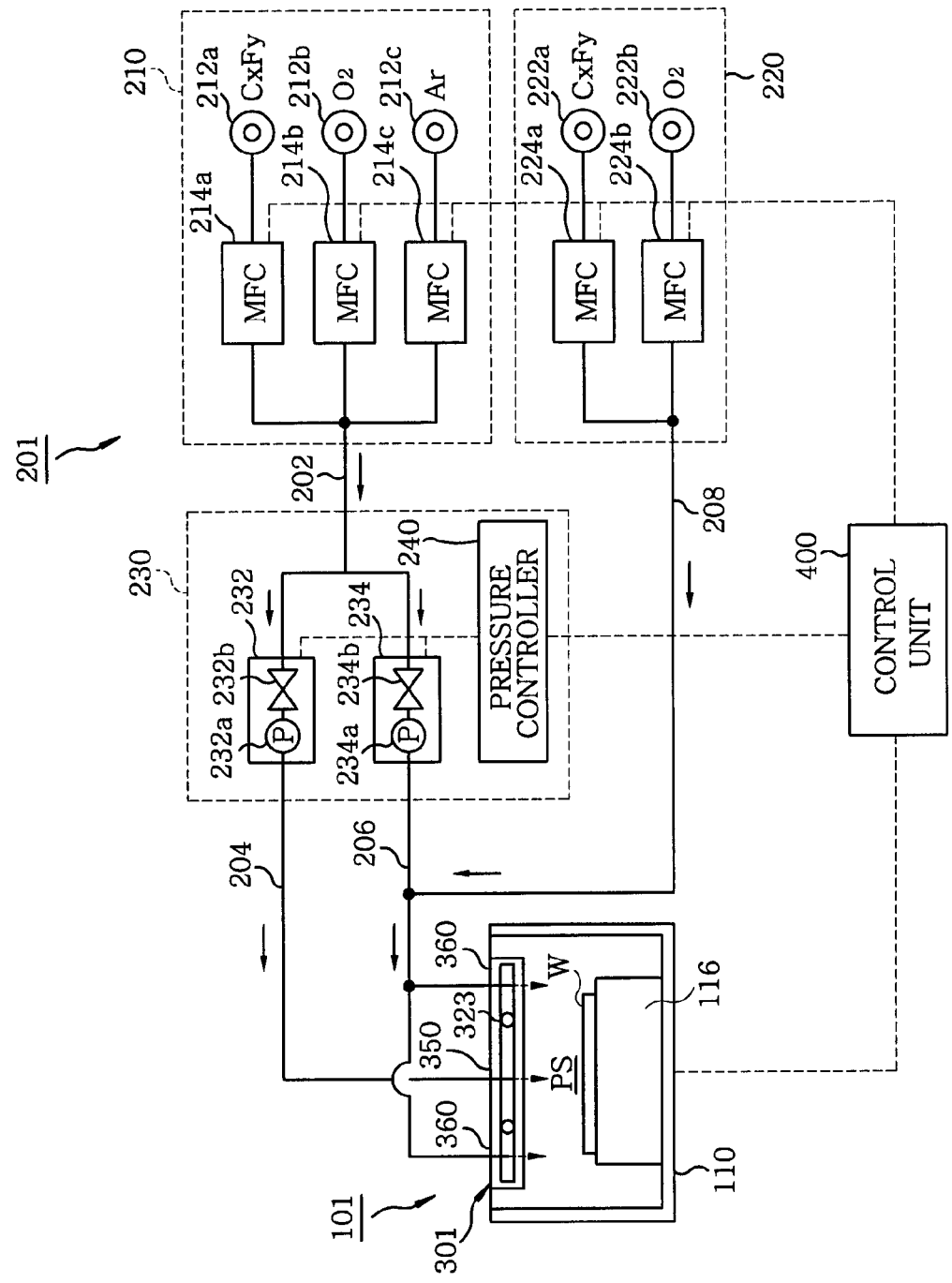
FIG. 16 is a block diagram showing a configuration of a gas supply system in accordance with the second embodiment of the present invention.

Here, a detailed configuration of each component of the gas supply system 201 will be described. FIG. 16 is a block diagram showing a detailed configuration of the gas supply system 201. The processing gas supply unit 210 includes, as shown in FIG. 16, a gas box accommodated therein a plurality of (e.g. three) gas supply sources 212a, 212b and 212c. A line of each of the gas supply sources 212a, 212b and 212c is connected to the processing gas supply line 202 where the gases from the gas supply sources are joined. The lines of the gas supply sources 212a, 212b and 212c are respectively provided with mass flow controllers 214a, 214b and 214c for adjusting flow rates of the gases. According to this processing gas supply unit 210, the gases from the gas supply sources 212a, 212b and 212c are mixed at a specific flow rate ratio, and the mixed gas flows through the processing gas supply line 202. And then, the gas is distributed into the first and the second branch line 204 and 206.

As shown in FIG. 16, the gas supply source 212a seals therein, e.g., a fluorocarbon-based fluorine compound, i.e., $C_xF_y$ gas such as $CF_4$, $C_4F_6$, $C_4F_8$, $C_5F_8$, etc., as an etching gas. The gas supply source 212b seals therein, e.g., $O_2$ gas as a gas for controlling the deposition of CF-based reaction products, and the gas supply source 212c seals therein an inert gas, e.g., Ar gas as a carrier gas. Further, the number of gas supply sources of the processing gas supply unit 210 is not limited to the example shown in FIG. 16, but may be one, two, or four or more.

Meanwhile, as shown in FIG. 16, the additional gas supply unit 220 includes, for example, a gas box accommodated therein a plurality of (e.g. two) gas supply sources 222a and 222b. A line of each of the gas supply sources 222a and 222b is connected to the additional gas supply line 208 where the gases from the gas supply sources are joined. The lines of the gas supply sources 222a and 222b are respectively provided with mass flow controllers 224a and 224b for adjusting flow rates of the gases. According to this additional gas supply unit 220, the gases from the gas supply sources 222a and 222b are mixed at a specific flow rate ratio, and the mixed gas flows through the additional gas supply line 208.

The gas supply source 222a seals therein, e.g., $C_xF_y$ gas capable of facilitating etching, and the gas supply source 222b seals therein, e.g., $O_2$ gas capable of controlling deposits of CF-based reaction products. Further, the number of gas supply sources of the additional gas supply unit 220 is not limited to the example shown in FIG. 16, but may be one or three or more.

The branch flow control unit 230 includes a pressure control unit 232 that adjusts the inner pressure of the first branch line 204, and a pressure control unit 234 that adjusts the inner pressure of the second branch line 206. Specifically, the pressure control unit 232 includes a pressure sensor 232a detecting the inner pressure of the first branch line 204, and a valve 232b adjusting the open degree of the first branch line 204. The pressure control unit 234 includes a pressure sensor 234a detecting the inner pressure of the second branch line 206, and a valve 234b adjusting the open degree of the second branch line 206.

The pressure control units 232 and 234 are connected to a pressure controller 240. The pressure controller 240 adjusts the open degree of each of the valves 232b and 234b based on the inner pressure detected by each of the pressure sensors 232a and 234a according to instructions from the control unit 400 controlling each component of the plasma processing apparatus 101. For example, the control unit 400 controls the branch flow control unit 230 by a pressure ratio control mode. In this mode, the pressure controller 240 adjusts the open degree of each of the valves 232b and 234b such that the flow rates of the first and the second processing gas reach a target flow rate ratio based on instructions from the control unit 400, i.e. such that the inner pressures of the first and the second branch line 204 and 206 reach a target pressure ratio. Further, the pressure controller 240 may be embedded in the branch flow control unit 230 as a control board, or may be separated from the branch flow control unit 230. Further, the pressure controller 240 may be provided in the control unit 400.

Further, in addition to the branch flow control unit 230, the control unit 400 shown in FIG. 15 controls the processing gas supply unit 210 and the additional gas supply unit 220 in the gas supply system 201, a first and a second high-frequency power supply 154 and 182 and the like.

(Configuration Example of Upper Electrode)

Figure 17:
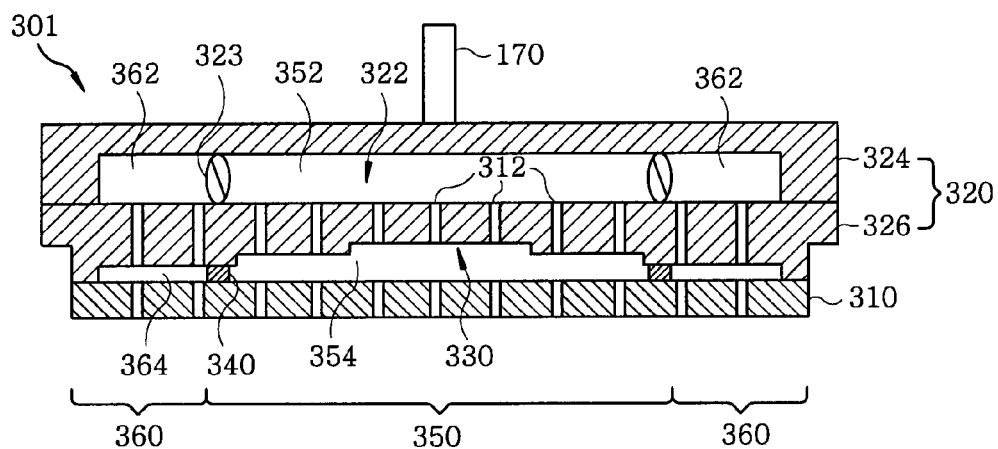
FIG. 17 is a cross sectional view showing a configuration of an upper electrode in accordance with the second embodiment of the present invention.

Here, a detailed configuration of the upper electrode 301 will be described with reference to the drawings. FIG. 17 is a schematic view showing a configuration of the inner upper electrode 302 of the upper electrode 301 in accordance with the present embodiment. Here, the upper electrode including an electrode support 320 formed therein a multi-stage hollow portion, e.g., a three-stage hollow portion, on the contact surface thereof with electrode plate 310 will be described as an example.

The upper electrode 301 in FIG. 17 includes the inner upper electrode 302 divided into a first and a second gas inlet 350 and 360. The first and the second gas inlet 350 and 360 are configured as follows. The electrode support 320 is provided therein with a buffer chamber 322 formed as a space having a disk shape. The buffer chamber 322 is partitioned into, by an annular buffer chamber partition member 323, a first buffer chamber 352 formed as a space having a disk shape and a second buffer chamber 362 formed as a space having a ring shape and surrounding the first buffer chamber 352. The annular buffer chamber partition member 323 is formed of, e.g., an O-ring.

Here, when the hollow portion 330 formed at the electrode support 320 has a large diameter and is provided over the plurality of gas inlets (e.g. the gas inlets 350 and 360), for example, if the hollow portion 330 formed at the electrode support 320 has a diameter greater than that of the first buffer chamber 352, as shown in FIG. 17, the hollow portion 330 is partitioned into, by an annular hollow portion partition member 340, a first and a second region 354 and 364 for the gas inlets 350 and 360, respectively. The annular hollow portion partition member 340 has a diameter similar to that of the annular buffer chamber partition member 323. In this manner, because the partition member partitioning the hollow portion for the gas inlets 350 and 360 is provided, the gases supplied to the gas inlets 350 and 360 can be prevented from being mixed with each other. A detailed configuration of the annular hollow portion partition member 340 will be described later.

The first gas inlet 350 includes the first buffer chamber 352, a plurality of gas injection openings 312 formed in the lower surface of the first buffer chamber 352, and the first region 354 of the hollow portion 330. The second gas inlet 360 includes the second buffer chamber 362, a plurality of gas injection openings 312 formed in the lower surface of the second buffer chamber 362, and the second region 364 of the hollow portion 330.

Each of the buffer chambers 352 and 362 is supplied with a specific gas from the gas supply system 201. A gas is injected to the center region of the wafer W through the first gas inlet 350 via the first buffer chamber 352, and another gas is injected to the edge region of the wafer W through the second gas inlet 360 via the second buffer chamber 362.

Like the first embodiment, when a high frequency electric power in a range from 27 to 150 MHz, e.g., 60 MHz, is applied to the upper electrode 301 from the first high-frequency power supply 154, a high-frequency electric field is generated between the upper electrode 301 and the susceptor 116 serving as the lower electrode.

Figure 18:
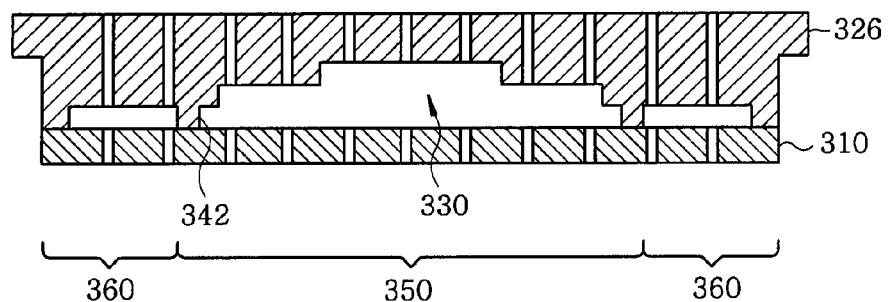
FIG. 18 is a configuration view of an annular hollow portion partition member formed of aluminum.

In this case, it can be found that, when the annular hollow portion partition member 340 is formed of a conductor such as a metal, the electric field is concentrated on the annular hollow portion partition member 340, and thus abnormal discharge occurs. Therefore, for example, as shown in FIG. 18, when the lower surface of the electrode support 320, formed of a conductor such as aluminum, is finished into a partition 342 of aluminum, there is a possibility of generating abnormal discharge depending on the intensity of the high-frequency electric power applied to the upper electrode 301.

Figure 19:
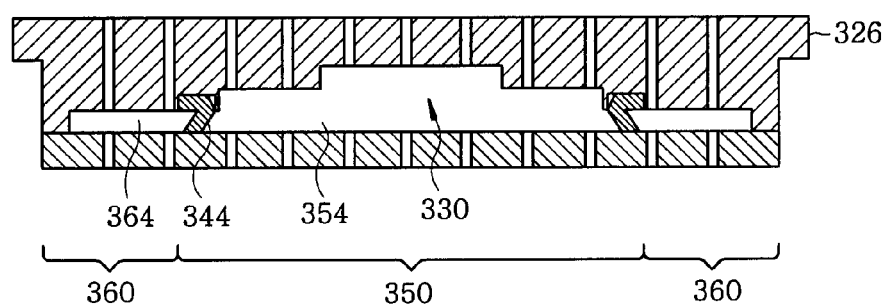
FIG. 19 is a configuration view of an annular hollow portion partition member formed of a resin ring.

For this reason, it is preferable that the annular hollow portion partition member 340 is formed of an insulator (e.g. resin-based or ceramic-based material) from the viewpoint of preventing abnormal discharge. For example, the annular hollow portion partition member 340 is formed of a resin ring 344 as shown in FIG. 19. The resin ring 344 is formed of a resin such as, e.g., PTFE (polytetrafluoroethylene), i.e., Teflon®, or polyimide including Vespel®.

Further, it is preferable that the resin ring 344 has a shape capable of being elastically-deformed easily when pushed down and having weak repulsive force, so that it can partition the hollow portion 330 between the electrode support 320 and the electrode plate 310 even if the clamping power therebetween is weak. Hence, in the present embodiment, for example, as shown in FIG. 19, the resin ring 344 is shaped in a manner such that side surface thereof is a tapered surface having a cross section of an approximate v shape. Thereby, the resin ring 344 is easy to be elastically-deformed and has weak repulsive force. Accordingly, it can sufficiently partition the hollow portion 330 even if the clamping power is weak as in the case of screwing an electrode plate 310 formed of, e.g., silicon onto the electrode support 320.

Figure 20:
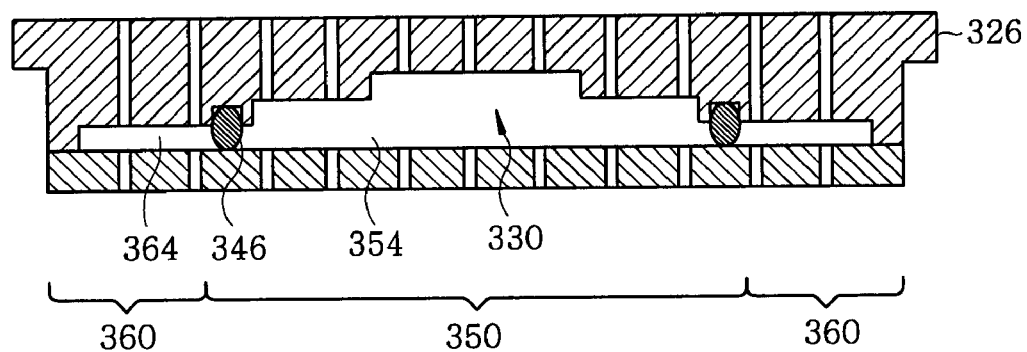
FIG. 20 is a configuration view of an annular hollow portion partition member formed of an O-ring.

Further, the annular hollow portion partition member 340 may be formed of an O-ring 346, as shown in FIG. 20. Like the resin ring 344, it is preferable that the O-ring 346 is shaped to be elastically-deformed easily when pushed down and have weak repulsive force. For example, as shown in FIG. 20, the O-ring 346 having a cross section of an elliptical shape is employed.

Figure 21:
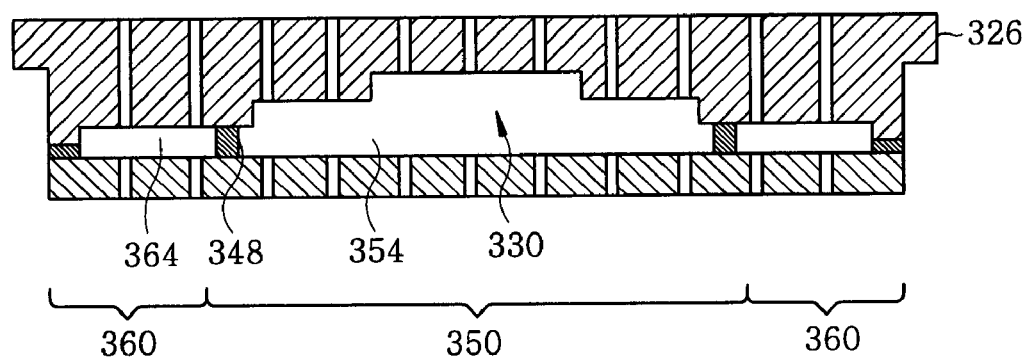
FIG. 21 is a configuration view of an annular hollow portion partition member formed by thermally spraying ceramic-based material onto the lower surface of an electrode support.

Also, for example, as shown in FIG. 21, the annular hollow portion partition member 340 may be a partition 348, which is formed by thermally spraying ceramic-based material, such as alumina, yttria and the like, onto the lower surface of the electrode support 320. In this case, for example, after the hollow portion is formed in the lower surface of the electrode support 320, the surface of the hollow portion is masked, and then the ceramic-based material is thermally sprayed toward the lower surface of the electrode support 320. Thereafter, the thermally sprayed part is polished to level the surface, and then the electrode plate 310 is attached. Further, instead of thermally spraying the ceramic-based material onto the lower surface of the electrode support 320, the resin-based material may be coated to form the annular hollow portion partition member 340.

Figure 22:
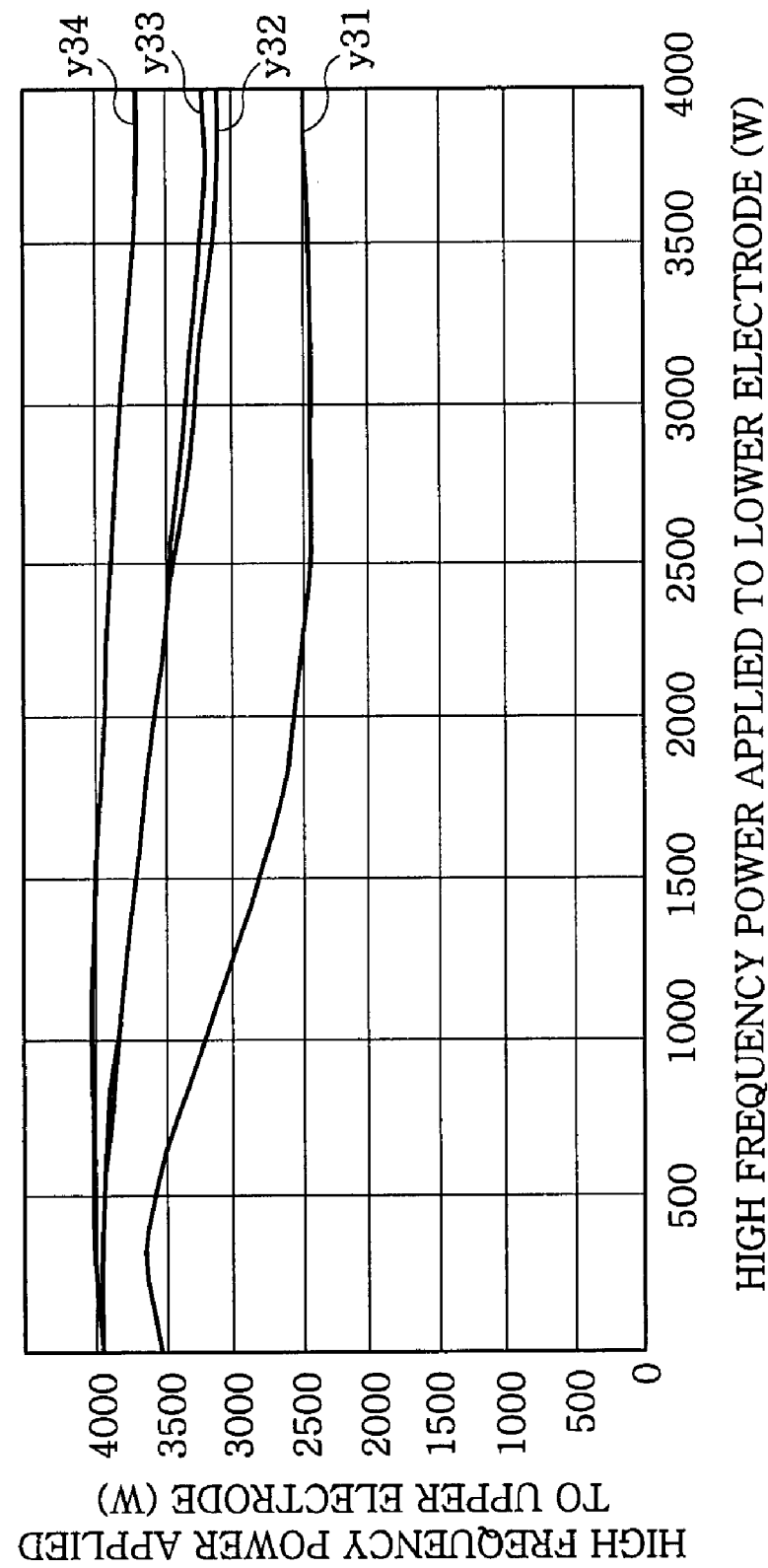
FIG. 22 illustrates the relationship between discharge and high-frequency electric power applied to an upper and a lower electrodes.

A description will be made regarding the test results of applying the high-frequency electric power to the upper electrode having the above-described annular hollow portion partition member 340 under conditions such that the abnormal discharge can be easily generated. For example, when the high-frequency electric power is applied to the upper electrode 301 and the susceptor 116 forming the lower electrode, the relationship between the applied voltage and the discharge is as shown in FIG. 22. In FIG. 22, the y-axis indicates the voltage applied to the upper electrode, and the x-axis indicates the voltage applied to the susceptor forming the lower electrode. The test is performed by varying the combination of these applied voltages, and the high-frequency electric power starting the discharge is plotted as a graph in FIG. 22. According to this graph, as the high-frequency electric power starting the discharge becomes high, the margin of the high-frequency electric power applied without generating a discharge becomes high, and thus it is difficult to generate the abnormal discharge.

In FIG. 22, y31 indicates the case in which the annular hollow portion partition member 340 is formed of aluminum (e.g. see FIG. 18), y32 indicates the case in which the annular hollow portion partition member 340 is formed of an O-ring (e.g. see FIG. 20), y33 indicates the case in which the annular hollow portion partition member 340 is formed by thermally spraying alumina (e.g. see FIG. 21), and y34 indicates the case in which the annular hollow portion partition member 340 is formed of Teflon® (e.g. see FIG. 19).

It can be found from FIG. 22 that the abnormal discharge is most easily generated in the case (y31) in which the annular hollow portion partition member 340 is formed of aluminum. The abnormal discharge is difficult to generate in the case (y32) in which the annular hollow portion partition member 340 is formed of an O-ring, and in the case (y33) in which the annular hollow portion partition member 340 is formed by thermally spraying alumina, compared to the case (y31) in which the annular hollow portion partition member 340 is formed of aluminum. The abnormal discharge is most difficult to generate in the case (y34) in which the annular hollow portion partition member 340 is formed of Teflon®. In this manner, it can be conjectured that the abnormal discharge can be effectively prevented by forming the annular hollow portion partition member 340 of an insulator, such as resin-based or ceramic-based material.

Further, the plasma processing apparatus having the upper electrode for introducing the gas into the processing chamber through two lines is not limited to the configuration having the gas supply system 201 of the type in which the additional gas is supplied to the second supply line, as shown in FIG. 15. For example, as shown in FIG. 23, the plasma processing apparatus may be configured to have the gas supply system 201 of the type capable of supplying the additional gas to any one selected from the first and second supply lines.

Figure 23:
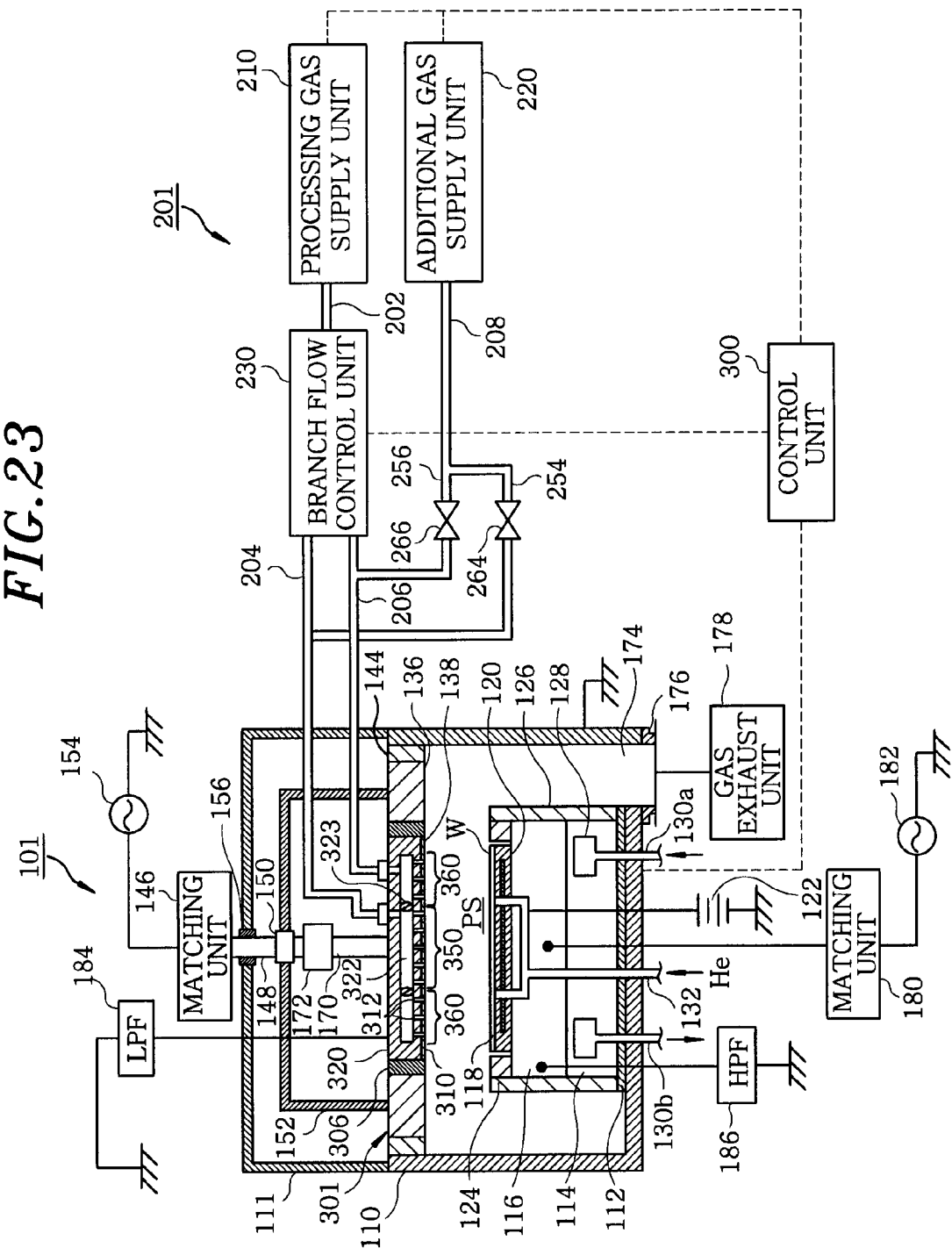
FIG. 23 is a cross sectional view showing another configuration of a plasma processing apparatus in accordance with the present invention.

To be specific, a first additional gas branch line 254 forming a first additional gas branch path and a second additional gas branch line 256 forming a second additional gas branch path are branched from the additional gas supply line 208 of the gas supply system 201 shown in FIG. 23.

The first and the second additional gas branch line 254 and 256 are, respectively, connected to the first and the second processing gas branch lines 204 and 206 forming the first and the second branch path, respectively, at the downstream side of the branch flow control unit 230. The first additional gas branch line 254 is provided with an opening/closing valve 264 opening and/or closing the first additional gas branch line 254, and the second additional gas branch line 256 is provided with an opening/closing valve 266 opening and/or closing the second additional gas branch line 256. By controlling the opening/closing valves 264 and 266, the additional gas from the additional gas supply unit 220 is allowed to be supplied to any one of the first and second branch lines 254 and 256. The opening/closing valves 264 and 266 form a flow path switching unit of the additional gas branch paths.

According to this gas supply system 201, the branch flow of the processing gas from the processing gas supply unit 210 is adjusted by the branch flow control unit 230, and is distributed into the first and the second processing gas branch line 204 and 206.

In case of supplying the additional gas to the second processing gas branch line 206, the opening/closing valve 264 of the first additional gas branch line 254 is closed while the opening/closing valve 266 of the second additional gas branch line 256 is open. In this state, the supply of the additional gas from the additional gas supply unit 220 is initiated. Thereby, the additional gas flows to the second processing gas branch line 206 via the additional gas supply line 208 and the second additional gas branch line 256, and is then mixed with the second processing gas. Then, the additional gas is supplied toward the edge portion of the wafer W via the second buffer chamber 362 together with the second processing gas.

Meanwhile, in case of supplying the additional gas to the first processing gas branch line 204, the opening/closing valve 266 of the second additional gas branch line 256 is closed while the opening/closing valve 264 of the first additional gas branch line 254 is open. In this state, the supply of the additional gas from the additional gas supply unit 220 is initiated. Thereby, the additional gas flows to the first processing gas branch line 204 via the additional gas supply line 208 and the first additional gas branch line 254, and is then mixed with the first processing gas. Then, the additional gas is supplied toward the center portion of the wafer W via the first buffer chamber 352 together with the first processing gas. According to the plasma processing apparatus 101 shown in FIG. 23, the additional gas mixed with any one selected from the first and the second processing gas can be supplied.

Further, although the gas supply system 201 shown in FIG. 23 has been described regarding the case in which the opening/closing valves 264 and 266 are provided to the first and the second additional gas branch line 254 and 256, respectively, and the flow paths through which the additional gas flows from the additional gas supply line 208 are switched by controlling the opening/closing valves 264 and 266 to be open or close, the present invention is not necessarily limited to this case. Therefore, an opening/closing valve, as another example of the flow path switching unit, may be provided to any one of the first and second branch lines 254 and 256, and the flow paths through which the additional gas flows from the additional gas supply line 208 may be switched by controlling the opening/closing valve to be open or close.

Further, in the gas supply system 201 shown in FIG. 23, the first and the second additional gas branch line 254 and 256 are provided with the opening/closing valves 264 and 266, respectively, so that the additional gases from the first and the second additional gas branch line 254 and 256 can be supplied to the first and the second processing gas branch lines 204 and 206, respectively. In this case, the first and the second additional gas branch line 254 and 256 may be respectively provided with flow rate controlling unit, such as mass flow controllers. Thereby, the flow rate of the processing gas flowing through each of the first and the second additional gas branch line 254 and 256 can be precisely controlled.

Further, in the second embodiment, the second processing gas branch line 206 may include three or more branch lines branched from the processing gas supply line 202 to supply the additional gas from the additional gas supply unit 220 to each of the second branch lines. Thereby, the upper electrode 301 can be divided into three or more processing gas inlets, each of which is supplied with the processing gas, so that the processing uniformity can be more precisely controlled in the edge region of the wafer.

Further, although the second embodiment has been described regarding the case in which the processing gas supplied from the gas supply system 201 is injected toward the wafer W at the upper portion of the processing chamber 110, the present invention is not necessarily limited to this case. However, the processing gas may be injected from another portion of the processing chamber 110, e.g., from the side surfaces of the plasma generation space PS in the processing chamber 110. Thereby, a specific processing gas can be supplied from the upper portion and lateral portions of the plasma generation space PS, so that the concentration of the gas in the plasma generation space PS can be controlled. Thus, the uniformity of the wafer processing can be further improved.

Further, the first and the second embodiments have been described taking the upper electrode having the hollow portion disposed on the rear side of the electrode plate, the hollow portion having a shape of the three-stage disk-like hollow portion having three stacked stages, as an example, but the shape of the hollow portion is not limited thereto. Any shape will do as long as the hollow portion has different heights at the center portion and the edge portion thereof. For example, the number of stages of the hollow portion may be two or four or more. Further, the hollow portion may have a tapered or curved shape in its cross section, as in the case in which the height thereof is gradually increased from the edge portion toward the center portion thereof.

The first and the second embodiments have been described regarding the case in which the high frequency electric power is applied to both the upper and the lower electrode, but the present invention is not necessarily limited thereto. The present invention can include the case in which the high frequency electric power is applied to the upper electrode only. Further, the case of applying a high frequency electric power in a range from 27 MHz to 150 MHz to the upper electrode has been described, but the high frequency electric power applied is not limited to this range. Also, the case of using the semiconductor wafer as the substrate to be processed, and etching the semiconductor wafer has been described, but the present invention is not limited to this case. Therefore, another substrate, such as an LCD (liquid crystal display) substrate, may be used as the substrate to be processed. In addition, the plasma processing is not limited to etching, and thus the present invention may be applied to another kind of processing, such as sputtering, CVD and the like.

The present invention can be applied to a plasma processing apparatus and to an electrode used therein.

As described above, the exemplary embodiments have been described with reference to the accompanying drawings, but the present invention is not limited to these embodiments.

While the invention has been shown and described with respect to the embodiments, it will be understood by those skilled in the art that various changes and modification may be made without departing from the scope of the invention as defined in the following claims.

What is claimed is:

1. An electrode for use as an upper electrode in a plasma processing apparatus for performing a specific plasma processing on a target substrate placed in a processing chamber having the upper electrode and a lower electrode the electrode for use as the upper electrode comprising:
   an electrode plate which has a plurality of gas injection openings;
   a support for detachably supporting the electrode plate; and
   a hollow portion serving as a dielectric portion, provided on a contact surface of the support with the electrode plate, and having a shape in which a thickness of a center portion thereof is thicker than that of an edge portion thereof,
   wherein dimensions of the hollow portion are determined such that an electric field perpendicular to the upper electrode is generated in the hollow portion when a high-frequency electric power is supplied to the upper electrode and a resonance occurs at the high-frequency.

2. The electrode of claim 1, wherein the hollow portion has a shape in which disk-like portions having different diameters from each other are stacked in multiple stages, and the disk-like portions are stacked from the contact surface with the electrode plate in decreasing order of the diameters.

3. The electrode of claim 2, wherein the hollow portion has three disk-like portions.

4. The electrode of claim 1, wherein a dielectric member is disposed in the hollow portion.

5. The electrode of claim 4,
   wherein the dielectric member has a relative dielectric constant of 1 to 10, and
   wherein the diameters of the first, the second and the third disk-like dielectric portions are in ranges from about 80% to 120%, from about 60% to 80% and from about 40% to 60% of the diameter of the target substrate, respectively.

6. The electrode of claim 4, wherein the dielectric member is made of a material selected from the group consisting of a quartz, a ceramic, and a resin.

7. The electrode of claim 4, wherein the dielectric member is formed in a single body.

8. The electrode of claim 1, further comprising an annular outer electrode surrounding the upper electrode.

9. The electrode of claim 1, wherein the support is divided into an upper member and a lower member serving as a cooling plate, and wherein the hollow portion is formed in the lower member.

10. An electrode for use as an upper electrode in a plasma processing apparatus for performing a specific plasma processing on a target substrate placed in a processing chamber having the upper electrode and a lower electrode, the electrode for use as the upper electrode comprising:
    an electrode plate which has a plurality of divided gas inlets, each gas inlet being provided with a plurality of gas injection openings;
    a support for detachably supporting the electrode plate;
    a hollow portion serving as a dielectric portion, provided on a contact surface of the support with the electrode plate, and having a shape in which a center portion thereof has a thickness different from that of an edge portion thereof; and
    a partition member for partitioning the hollow portion into a plurality of regions, each region belonging to one of the gas inlets.

11. The electrode of claim 10, wherein the partition member is formed of an insulator.

12. The electrode of claim 10, wherein the partition member is formed of a resin ring whose side surface is a tapered surface having a cross section of an approximate v shape.

13. The electrode of claim 10, wherein the partition member is formed by thermally spraying ceramic-based material.

14. A plasma processing apparatus comprising:
    a processing chamber in which a target subject is processed therein; and
    a lower electrode, disposed in the processing chamber, to support the target subject; and
    an upper electrode facing the lower electrode,
    wherein the upper electrode includes:
    an electrode plate which has a plurality of divided gas inlets, each gas inlet being provided with a plurality of gas injection openings;
    a support for detachably supporting the electrode plate; and
    a hollow portion serving as a dielectric portion, provided on a contact surface of the support with the electrode plate, and having a shape in which a center portion thereof has a thickness different from that of an edge portion thereof, and wherein dimensions of the hollow portion are determined such that an electric field perpendicular to the upper electrode is generated in the hollow portion when a high-frequency electric power is supplied to the upper electrode and a resonance occurs at the high-frequency.

15. The electrode of claim 14, wherein the support is divided into an upper member and a lower member serving as a cooling plate, and wherein the hollow portion is formed in the lower member.

16. The electrode of claim 14, wherein a dielectric member is disposed in the hollow portion.

17. The electrode of claim 14, further comprising an annular outer electrode surrounding the upper electrode.

18. A plasma processing apparatus comprising:
a processing chamber in which a target subject is processed therein;
a lower electrode, disposed in the processing chamber, to support the target subject; and
an upper electrode facing the lower electrode,
wherein the upper electrode includes:
an electrode plate which has a plurality of gas injection openings;
a support for detachably supporting the electrode plate; and
a hollow portion serving as a dielectric portion, provided on a contact surface of the support with the electrode plate,
wherein the hollow portion has a shape in which a first, a second and a third disk-like portions having different diameters from each other are stacked from the contact surface with the electrode plate such that the thickness of the center portion thereof is thicker than that of the edge portion thereof, and
wherein dimensions of the hollow portion are determined such that an electric field perpendicular to the upper electrode is generated in the hollow portion when a high-frequency electric power is supplied to the upper electrode and a resonance occurs at the high-frequency.

19. A plasma processing apparatus comprising:
a processing chamber in which a target subject is processed therein;
a lower electrode, disposed in the processing chamber, to support the target subject; and
an upper electrode facing the lower electrode,
wherein the upper electrode includes:
an electrode plate which has a plurality of divided gas inlets, each gas inlet being provided with a plurality of gas injection openings;
a support for detachably supporting the electrode plate;
a hollow portion serving as a dielectric portion, provided on a contact surface of the support with the electrode plate, and having a shape in which a center portion thereof has a thickness different from that of an edge portion thereof; and
a partition member for partitioning the hollow portion into a plurality of regions, each region belonging to one of the gas inlets.

20. The plasma processing apparatus of claim 19, wherein the plurality of divided gas inlets includes a first and a second gas inlet, and wherein the plasma processing apparatus comprises:
a processing gas supply unit for supplying the processing gas for processing the target substrate;
a processing gas supply line for allowing the processing gas from the processing gas supply unit to flow therein;
a first and a second branch line branched from the processing gas supply line to be connected with the first and the second gas inlet, respectively;
a branch flow control unit for controlling branch flows of the processing gas distributed from the processing gas supply line to the first and the second branch line based on inner pressures of the first and the second branch line, respectively;
an additional gas supply unit for supplying an additional gas; and
an additional gas supply line, joining the first or the second branch line at a downstream side of the branch flow control unit, for allowing the additional gas from the additional gas supply unit to flow therein.

* * * * *